US012321842B2

(12) United States Patent
Yeo et al.

(10) Patent No.: US 12,321,842 B2
(45) Date of Patent: Jun. 3, 2025

(54) ELECTRONIC APPARATUS AND METHOD FOR CONTROLLING THEREOF

(71) Applicant: SAMSUNG ELECTRONICS CO., LTD., Suwon-si (KR)

(72) Inventors: Jinsu Yeo, Suwon-si (KR); Youngyoon Lee, Suwon-si (KR); Youngcheon You, Suwon-si (KR); Jaechool Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 835 days.

(21) Appl. No.: 17/505,259

(22) Filed: Oct. 19, 2021

(65) Prior Publication Data

US 2022/0036152 A1 Feb. 3, 2022

Related U.S. Application Data

(63) Continuation of application No. PCT/KR2021/001752, filed on Feb. 9, 2021.

(30) Foreign Application Priority Data

May 8, 2020 (KR) .................. 10-2020-0055341

(51) Int. Cl.
*G06N 3/04* (2023.01)
*G06F 11/34* (2006.01)
(Continued)

(52) U.S. Cl.
CPC ........... *G06N 3/04* (2013.01); *G06F 11/3409* (2013.01); *H03M 7/702* (2013.01); *G06N 3/044* (2023.01);
(Continued)

(58) Field of Classification Search
CPC ........ G06N 3/04; G06N 3/082; G06N 3/0985; G06N 3/0495; G06N 3/044; G06N 3/0464;
(Continued)

(56) References Cited

U.S. PATENT DOCUMENTS

| 7,724,962 B2 | 5/2010 | Zhu et al. |
| 10,223,635 B2 | 3/2019 | Annapureddy et al. |

(Continued)

FOREIGN PATENT DOCUMENTS

| KR | 10-2017-0106338 A | 9/2017 |
| KR | 10-2018-0045635 A | 5/2018 |

(Continued)

OTHER PUBLICATIONS

Swathi et al., (NPL "Image compression using singular value decomposition" Published 2017 (9 pages) (Year: 2017).*

(Continued)

*Primary Examiner* — Quoc A Tran
(74) *Attorney, Agent, or Firm* — Sughrue Mion, PLLC

(57) ABSTRACT

A method for controlling an electronic apparatus is provided. The method for controlling an electronic apparatus includes the steps of selecting a generic-purpose artificial intelligence model, generating a compressed artificial intelligence model based on the selected generic-purpose artificial intelligence model, and generating a dedicated artificial intelligence model based on the generated compressed artificial intelligence model, and the step of generating a compressed artificial intelligence model includes the steps of acquiring a rank of a singular value decomposition (SVD) algorithm based on a compression rate, compressing and training the selected generic-purpose artificial intelligence model based on the acquired rank and converting the model into the compressed artificial intelligence model, determin- (Continued)

ing the performance of the converted compressed artificial intelligence model based on a predetermined first threshold value, and based on the performance of the converted compressed artificial intelligence model being lower than the predetermined first threshold value, generating the dedicated artificial intelligence model.

15 Claims, 15 Drawing Sheets

(51) Int. Cl.
| | |
|---|---|
| *G06N 3/044* | (2023.01) |
| *G06N 3/045* | (2023.01) |
| *G06N 3/0464* | (2023.01) |
| *G06N 3/0495* | (2023.01) |
| *G06N 3/08* | (2023.01) |
| *G06N 3/082* | (2023.01) |
| *G06N 3/09* | (2023.01) |
| *G06N 3/0985* | (2023.01) |
| *H03M 7/30* | (2006.01) |

(52) U.S. Cl.
CPC ........... *G06N 3/045* (2023.01); *G06N 3/0464* (2023.01); *G06N 3/0495* (2023.01); *G06N 3/08* (2013.01); *G06N 3/082* (2013.01); *G06N 3/09* (2023.01); *G06N 3/0985* (2023.01); *H03M 7/3059* (2013.01); *H03M 7/70* (2013.01)

(58) Field of Classification Search
CPC . G06N 3/09; G06N 3/08; G06N 3/045; G06F 11/3409; H03M 7/702; H03M 7/3059; H03M 7/70
See application file for complete search history.

(56) References Cited

U.S. PATENT DOCUMENTS

| | | | |
|---|---|---|---|
| 10,490,198 B2 | 11/2019 | Kim et al. | |
| 10,515,307 B2 | 12/2019 | Sainath et al. | |
| 10,755,162 B2 | 8/2020 | Han et al. | |
| 2015/0170020 A1 | 6/2015 | Garimella | |
| 2016/0217369 A1 | 7/2016 | Annapureddy et al. | |
| 2017/0220925 A1 | 8/2017 | Alsharif et al. | |
| 2018/0046894 A1 | 2/2018 | Yao | |
| 2018/0114110 A1 | 4/2018 | Han et al. | |
| 2019/0080222 A1 | 3/2019 | Glesner et al. | |
| 2019/0228284 A1 | 7/2019 | Holland | |
| 2019/0236353 A1 | 8/2019 | Nakata et al. | |
| 2019/0279095 A1 | 9/2019 | Guntoro et al. | |
| 2019/0370658 A1 | 12/2019 | Xie et al. | |
| 2020/0026977 A1 | 1/2020 | Lee et al. | |

FOREIGN PATENT DOCUMENTS

| | | | | |
|---|---|---|---|---|
| KR | 10-2018-0084988 A | | 7/2018 | |
| KR | 10-2020-0013162 A | | 2/2020 | |
| KR | 20200013162 A | * | 2/2020 | ............... G06N 3/08 |
| KR | 10-2020-0027080 A | | 3/2020 | |
| WO | 2016/118257 A1 | | 7/2016 | |
| WO | 2017/136070 A1 | | 8/2017 | |

OTHER PUBLICATIONS

International Search Report (PCT/ISA/210) issued by the International Searching Authority in International Application No. PCT/KR2021/001752, issued on May 27, 2021.
Written Opinion (PCT/ISA/237) issued by the International Searching Authority in International Application No. PCT/KR2021/001752, issued on May 27, 2021.
Kholiavchenko, M., "Iterative Low-Rank Approximation for CNN Compression" Computer Science and Engineering, (Nov. 15, 2019), arXiv:1803.08995v2 [cs.CV}, 5 pages. XP81561157A.
Goetschalckx, K, et al., "Efficiently Combining SVD, Pruning, Clustering and Retraining for Enhanced Neural Network Compression" 2nd International Workshop on Embedded and Mobile Deep Learning, (Jun. 15, 2018), 6 pages. XP58417154A, https://doi.org/10.1145/3212725.3212733.
Dudziak, L., et al., "ShrinkML: End-to-End ASR Model Compression Using Reinforcement Learning" Samsung AI Center, Cambridge, University of Oxford, arXiv:1907.03540v2 [cs.LG], (Sep. 24, 2019), 5 pages. XP81494600A.
Communication issued May 3, 2023 from the European Patent Office in EP Application No. 21800775.5.
Communication dated Jan. 3, 2025, issued by the European Patent Office in European Application No. 21800775.5.

* cited by examiner

FIG. 6

```
Meta data: [Compress Parameter, Data Description]

Compress Parameter: rank R0
Data Description (D0):
- Noisy Environment
- Distant Sound Source
- Near Sound Source
- Clean Environment (without noise)
- Dictation (large amount of words)
- Voice Command (large amount of words)
...

Compress Parameter: rank R1 (R1<R0)
Data Description (D1):
- Distant Sound Source
- Near Sound Source
- Clean Environment (without noise)
- Dictation (large amount of words)
- Voice Command (small amount of words)
...

Compress Parameter: rank R2 (R2<R0)
Data Description (D2):
- Near Sound Source
- Clean Environment (without noise)
- Voice Command (small amount of words)
...
```

ELECTRONIC APPARATUS AND METHOD FOR CONTROLLING THEREOF

CROSS-REFERENCE TO RELATED APPLICATION(S)

This application is a bypass continuation application of International Application PCT/KR2021/001752 filed on Feb. 9, 2021, which claims priority to Korean Patent Application No. 10-2020-0055341, filed on May 8, 2021, in the Korean Intellectual Property Office, the disclosures of which are incorporated herein in their entireties by reference.

TECHNICAL FIELD

The disclosure relates to an electronic apparatus and a method for controlling thereof, and more particularly, to an electronic apparatus including an artificial intelligence model, and a method for controlling thereof.

BACKGROUND ART

Artificial intelligence systems implementing intelligence of a human level are being developed. An artificial intelligence system is a system wherein a machine learns and determines by itself, unlike conventional rule-based systems. Artificial intelligence systems are being utilized in various ranges such as voice recognition, image recognition, and future prediction, etc.

In particular, an artificial intelligence system that solves a given problem through a deep neural network based on deep learning is being developed.

A deep neural network is a neural network that includes a plurality of hidden layers between an input layer and an output layer, and is used to provide a model that implements artificial intelligence technologies through neurons included in each layer.

In general, a deep neural network may include a plurality of neurons (or nodes) for deriving a correct result value.

In case where a vast amount of neurons exist, there is a problem that a lot of time is spent on an operation for deriving an output value, although accuracy of an output value for an input value becomes high.

DISCLOSURE OF INVENTION

Technical Problem

Provided is an electronic apparatus that generates a compressed artificial intelligence model based on an artificial intelligence model included in the electronic apparatus, and performs an operation for an input value by using the generated compressed artificial intelligence model, and thereby utilizes resources effectively.

Solution to Problem

A method for controlling an electronic apparatus according to an embodiment of the disclosure includes the steps of selecting a generic-purpose artificial intelligence model, generating a compressed artificial intelligence model based on the selected generic-purpose artificial intelligence model, and generating a dedicated artificial intelligence model based on the generated compressed artificial intelligence model, and the step of generating a compressed artificial intelligence model includes the steps of acquiring a rank of a singular value decomposition (SVD) algorithm based on a compression rate, compressing and training the selected generic-purpose artificial intelligence model based on the acquired rank and converting the model into the compressed artificial intelligence model, determining the performance of the converted compressed artificial intelligence model based on a predetermined first threshold value, and based on the performance of the converted compressed artificial intelligence model being lower than the predetermined first threshold value, generating the dedicated artificial intelligence model.

Meanwhile, an electronic apparatus according to another embodiment of the disclosure includes a memory storing first learning data and a generic-purpose artificial intelligence model trained by the first learning data, and a processor, wherein the processor is configured to select the trained generic-purpose artificial intelligence model, acquire a rank of a singular value decomposition (SVD) algorithm based on a compression rate, compress and train the selected generic-purpose artificial intelligence model based on the acquired rank and convert the model into the compressed artificial intelligence model, determine the performance of the converted compressed artificial intelligence model based on a predetermined first threshold value, and based on the performance of the converted compressed artificial intelligence model being lower than the predetermined first threshold value, generate a dedicated artificial intelligence model.

BRIEF DESCRIPTION OF DRAWINGS

FIG. 6 is a diagram showing information on a dedicated artificial intelligence model and information on a learning data set stored in a memory according to an embodiment;

MODE FOR THE INVENTION

Figure 1:
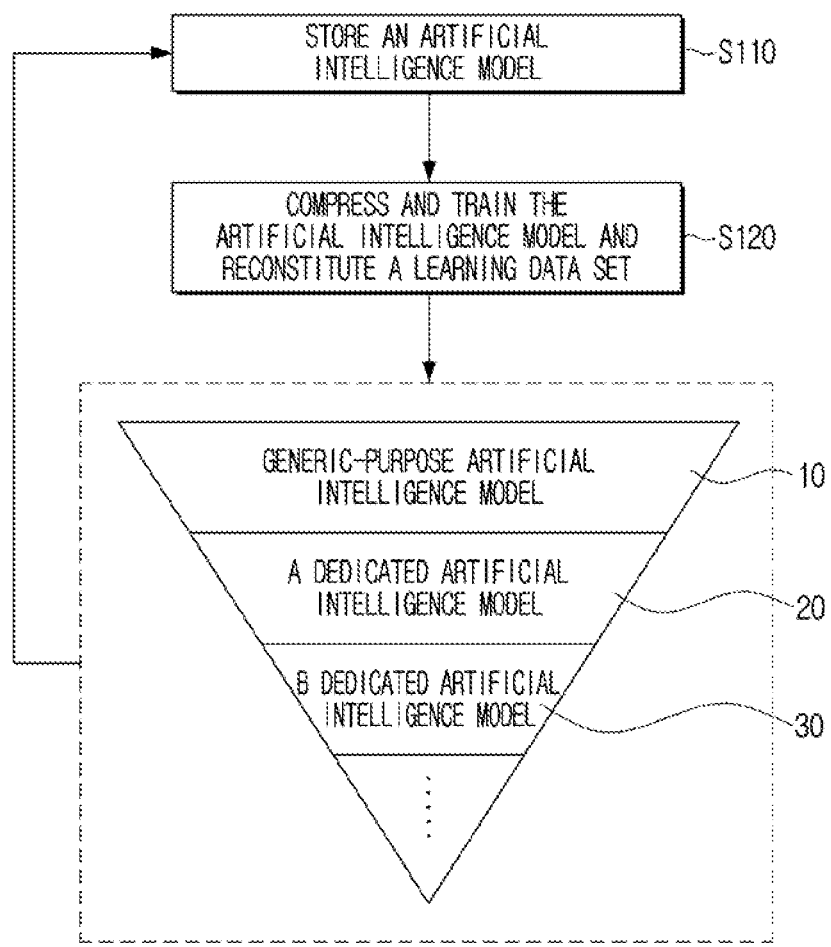
FIG. 1 is a schematic diagram of a process of an electronic apparatus generating artificial intelligence models in various sizes from one artificial intelligence model according to an embodiment.

Hereinafter, various example embodiments will be described with reference to the accompanying drawings. However, it should be noted that the various example embodiments are not for limiting the technology described in the disclosure to a specific embodiment, but they should be interpreted to include various modifications, equivalents, and/or alternatives of the embodiments of the disclosure. Also, with respect to the detailed description of the drawings, similar components may be designated by similar reference numerals.

In addition, expressions such as "have," "may have," "include," and "may include" denote the existence of such characteristics (e.g.: elements such as numbers, functions, operations, and components), and do not exclude the existence of additional characteristics.

Also, the expressions "A or B," "at least one of A and B," "at least one of A or B," "one or more of A and B," or "one or more of A or B" and the like may include all possible combinations of the listed items. For example, "A or B," "at least one of A and B," or "at least one of A or B" may refer to all of the following cases: (1) including at least one A, (2) including at least one B, or (3) including at least one A and at least one B.

In addition, the expressions "first," "second," and the like may describe various elements regardless of any order and/or degree of importance. Also, such expressions are used only to distinguish one element from another element, and are not intended to limit the elements.

The description that one element (e.g.: a first element) is "(operatively or communicatively) coupled with/to" or "connected to" another element (e.g.: a second element) should be interpreted to include both the case where the one element is directly coupled to the another element, and the case where the one element is coupled to the another element through still another element (e.g.: a third element). In contrast, the description that one element (e.g.: a first element) is "directly coupled" or "directly connected" to another element (e.g.: a second element) can be interpreted to mean that still another element (e.g.: a third element) does not exist between the one element and the another element.

The expression "configured to" may be interchangeably used with other expressions such as "suitable for," "having the capacity to," "designed to," "adapted to," "made to," and "capable of," depending on cases. The term "configured to" does not necessarily mean that an apparatus is "specifically designed to" in terms of hardware. Instead, under some circumstances, the expression "an apparatus configured to" may mean that the apparatus "is capable of" performing an operation together with another apparatus or component. For example, the phrase "a sub-processor configured to perform A, B, and C" may mean a dedicated processor (e.g.: an embedded processor) for performing the corresponding operations, or a generic-purpose processor (e.g.: a central processing unit (CPU) or an application processor) that can perform the corresponding operations by executing one or more software programs stored in a memory device.

Also, the term user may refer to a person using an electronic apparatus or an apparatus using an electronic apparatus (e.g.: an artificial intelligence electronic apparatus).

The electronic apparatus may include an artificial intelligence learning model.

Hereinafter, the disclosure will be described in detail with reference to the drawings.

FIG. 1 is a schematic diagram of a process of an electronic apparatus generating artificial intelligence models in various sizes from one artificial intelligence model according to an embodiment.

An electronic apparatus according to the various embodiments may be an apparatus that provides output data for input data by using an artificial intelligence model (or an artificial neural network model).

An electronic apparatus according to the various embodiments may include, for example, at least one of a smartphone, a tablet PC, a mobile phone, a video phone, an e-book reader, a desktop PC, a laptop PC, a netbook computer, a workstation, a server, a PDA, a portable multimedia player (PMP), an MP3 player, a kiosk, a medical device, a camera, or a wearable device. A wearable device may include at least one of an accessory-type device (e.g.: a watch, a ring, a bracelet, an ankle bracelet, a necklace, glasses, a contact lens, or a head-mounted-device (HMD)), a device integrated with fabrics or clothing (e.g.: electronic clothing), a body-attached device (e.g.: a skin pad), or an implantable circuit. Also, in some embodiments, an electronic apparatus may include, for example, at least one of a television, a digital video disk (DVD) player, an audio, a refrigerator, an air conditioner, a cleaner, an oven, a microwave oven, a washing machine, an air purifier, a set top box, a home automation control panel, a security control panel, a media box, a game console, an electronic dictionary, an electronic key, a camcorder, or an electronic photo frame. However, the disclosure is not limited thereto, and an electronic apparatus can be any apparatus that can perform an operation of a neural network model.

An artificial intelligence model may be an artificial intelligence model including an artificial neural network trained through machine learning or deep learning. An artificial intelligence model may consist of a plurality of neural network layers. Each of the plurality of neural network layers may have a plurality of weight values, and may perform a neural network operation through an operation between the operation result of the previous layer and the plurality of weight values. The plurality of weight values that the plurality of neural network layers have may be optimized by a learning result of an artificial intelligence model. For example, the plurality of weight values may be updated such that a loss value or a cost value acquired from an artificial intelligence model during a learning process is reduced or minimized. An artificial neural network may include a deep neural network (DNN), and there are, for example, a convolutional neural network (CNN), a deep neural network (DNN), a recurrent neural network (RNN), a restricted Boltzmann Machine (RBM), a deep belief network (DBN), a bidirectional recurrent deep neural network (BRDNN), or deep Q-networks, etc., but the disclosure is not limited to the aforementioned examples.

One artificial intelligence model may be stored in an electronic apparatus in operation S110. The artificial intelligence model may be a generic-purpose artificial intelligence model 10 trained by various learning data. Also, the generic-purpose artificial intelligence model 10 may be a model trained at the electronic apparatus, and it may also be a model trained at an external server and stored in the electronic apparatus.

The generic-purpose artificial intelligence model 10 may be an artificial intelligence model trained by various kinds of learning data so that it can be used in various apparatuses or various environments. That is, the generic-purpose artificial intelligence model 10 may be an artificial intelligence model trained to perform various operations from a simple operation to a complex operation. For example, in a voice recognition technology, a generic-purpose artificial intelligence model may refer to a model trained to receive input of not only voice data for a simple control command in a speaker, a refrigerator, and an air conditioner, but also voice data for a command such as inference, search, and recommendation in a smartphone and provide output data for the voice data. For example, in an object recognition technology, a generic-purpose artificial intelligence model may refer to a model trained to not only simply recognize an object, but also understand a space or an atmosphere through an object. These are merely embodiments, and sizes or shapes of generic-purpose artificial intelligence models may be diverse according to technical fields or learning data.

As the generic-purpose artificial intelligence model 10 is trained by using various data, it has an advantage that it can provide output values for various input values, but there are problems that its size is big and a lot of resources (e.g., a memory, a CPU, a GPU, etc.) are consumed when it performs an operation for an input value. Accordingly, the electronic apparatus may generate compressed artificial intelligence models 20, 30 in various sizes that are smaller than the generic-purpose artificial intelligence model 10, and which maintain the same or similar performance as the generic-purpose artificial intelligence model.

As such, the electronic apparatus may compress the artificial intelligence model in operation S120. Specifically, the electronic apparatus may repetitively compress the generic-purpose artificial intelligence model 10 and generate compressed artificial intelligence models such as an A dedicated artificial intelligence model 20 or a B dedicated artificial intelligence model 30.

A dedicated artificial intelligence model corresponds to a generic-purpose artificial intelligence model, and it refers to an artificial intelligence model trained to be used in a specific apparatus or environment. For example, in a voice recognition technology, the dedicated artificial intelligence model may be an artificial intelligence model trained to receive voice data for a simple control command in an air conditioner as input data and provide output data, or it may be an artificial intelligence model trained to receive voice data uttered in a quiet environment as input data and provide output data.

Compressing an artificial intelligence model means reducing the size of an artificial neural network included in the artificial intelligence model, and specifically, it means reducing the size of data related to connections among a plurality of nodes (connections of weight values) included in layers of an artificial neural network. For example, in a case where a first layer and a second layer in an artificial intelligence model respectively include four nodes and 16 connections exist between the first layer and the second layer, the electronic apparatus may compress the artificial intelligence model by adding a third layer having one node between the first layer and the second layer and reducing the connections between the first layer and the second layer to eight (four between the first layer and the third layer, and four between the third layer and the second layer). Alternatively, the electronic apparatus may compress the artificial intelligence model by reducing the number of nodes included in the first layer or the second layer. Alternatively, according to another embodiment, the electronic apparatus may compress the artificial intelligence model by reducing the number of bits of data indicating the connections among the plurality of nodes included in the artificial intelligence model. However, the disclosure is not limited to the aforementioned examples, and the electronic apparatus may compress the artificial intelligence model by reducing the size of data related to the connections among the plurality of nodes included in the neural network by various methods. A specific compression process of an artificial intelligence model according to an embodiment will be described in detail in FIG. 2.

The electronic apparatus may repetitively compress the generic-purpose artificial intelligence model 10 based on the performance of an artificial intelligence model compressed based on the generic-purpose artificial intelligence model 10. Performance of an artificial intelligence model indicates the number of cases wherein an output value for an input value coincides with a target value or close to a target value as a result of testing a trained artificial intelligence model.

After compressing the generic-purpose artificial intelligence model 10, the electronic apparatus may train and test the compressed artificial intelligence model. The electronic apparatus may repetitively compress the artificial intelligence model until the performance of the trained artificial intelligence model is within a predetermined range. For example, the electronic apparatus may repetitively compress the artificial intelligence model until the performance of the artificial intelligence model compressed based on the generic-purpose artificial intelligence model becomes 79% or higher and 82% or lower. This is merely an embodiment, and the electronic apparatus may repetitively compress the artificial intelligence model until the performance of the artificial intelligence model becomes a predetermined threshold value (e.g., 82%) or lower.

After compressing the artificial intelligence model until the performance of the compressed artificial intelligence model becomes a predetermined performance, the electronic apparatus may reconstitute a learning data set in operation S120.

Specifically, the electronic apparatus may additionally compress the compressed artificial intelligence model after the performance of the compressed artificial intelligence model reaches within a predetermined range (or a predetermined threshold value or lower) by a compression process, and here, a learning data set may be reconstituted for improving the performance of the additionally compressed artificial intelligence model.

More specifically, the electronic apparatus may classify learning data that trained the generic-purpose artificial intelligence model 10 into a plurality of data sets based on a predetermined rule, and select at least one data set among the plurality of classified data sets and reconstitute the learning data set. Reconstruction of a learning data set will be described in detail in FIG. 2.

The electronic apparatus 100 may train the additionally compressed artificial intelligence model by using the learning data set reconstituted from the learning data according to the predetermined rule. Here, as the additionally compressed artificial intelligence model is trained by a learning data set corresponding to some of the learning data that trained the generic-purpose artificial intelligence model, it may be a dedicated artificial intelligence model 20, 30. For example, an artificial intelligence model trained by using the reconstituted learning data set A may be the A dedicated artificial intelligence model 20.

For example, if, in a voice recognition technology, learning data was voice data used in a smartphone, and a generic-purpose artificial intelligence model was a smartphone-based voice recognition model, a reconstituted learning data set may be voice data used in a TV selected in the initial learning data, and an artificial intelligence model trained by the reconstituted learning data set may be a TV-based voice recognition model.

Since a dedicated artificial intelligence model may be a compressed generic-purpose artificial intelligence model, it may have a smaller size than a generic-purpose artificial intelligence model. In particular, the size of data related to connections among a plurality of nodes included in a dedicated artificial intelligence model may be smaller than the size of data related to connections among a plurality of nodes included in a generic-purpose artificial intelligence model.

The electronic apparatus 100 may store the A dedicated artificial intelligence model 20 in the electronic apparatus in operation S110.

The electronic apparatus 100 may continuously compress and train the A dedicated artificial intelligence model 20 while checking the performance of the A dedicated artificial intelligence model 20. In case the performance of the A dedicated artificial intelligence model 20 satisfies a predetermined condition, the electronic apparatus may reconstitute a data set from the learning data based on the predetermined rule again and generate a data set B, and train the B dedicated artificial intelligence model 30 by using the data set B. Also, the electronic apparatus may store the trained B dedicated artificial intelligence model 30 in the electronic apparatus. As explanation in this regard will overlap with the compression of a generic-purpose artificial intelligence model and reconstitution of a data set described above, detailed explanation will be omitted.

As described above, the electronic apparatus 100 may repetitively perform compression of an initial generic-purpose artificial intelligence model and reconstitution of a learning data set, and generate one or more dedicated artificial intelligence models of various sizes and uses. Since the generated artificial intelligence models in various sizes may be trained by a data set selected according to a predetermined rule, they may exert a performance of a specific level.

Figure 2:
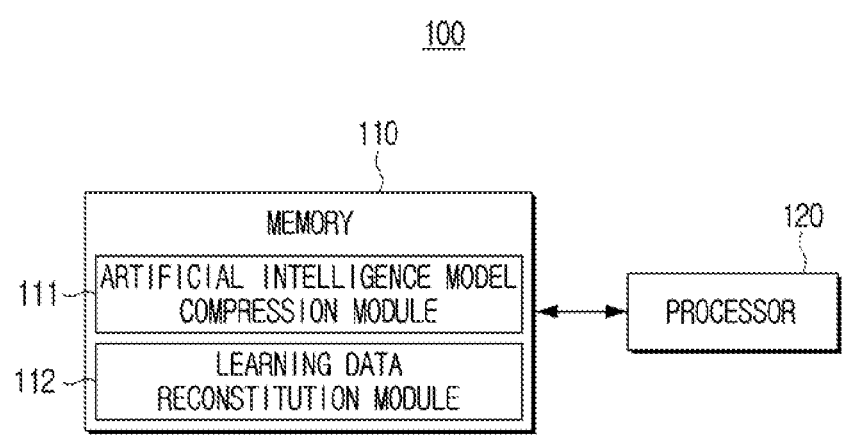
FIG. 2 is a block diagram showing a configuration of an electronic apparatus according to various embodiments.

FIG. 2 is a diagram for illustrating a configuration of an electronic apparatus according to various embodiments. Referring to FIG. 2, the electronic apparatus 100 may include a memory 110 and a processor 120. Functions related to artificial intelligence may be operated through the processor 120 and the memory 110.

The memory 110 is a component for storing an operating system (OS) for controlling the overall operations of the components of the electronic apparatus 100 and at least one instruction or data related to the components of the electronic apparatus 100. An instruction means one action statement that can be directly executed by the processor 120 in a programming drafting language, and it is a minimum unit for execution or operation of a program.

The processor 120 may perform operations according to various embodiments that will be described below by executing at least one instruction stored in the memory 110.

The memory 110 is a component for storing various kinds of programs and data, etc. necessary for the operations of the electronic apparatus 100. The memory 110 may be implemented as a non-volatile memory, a volatile memory, a flash-memory, a hard disk drive (HDD) or a solid state drive (SSD), etc. Also, the memory 110 may be accessed by the processor 120, and reading/recording/correcting/deleting/updating, etc. of data by the processor 120 may be performed. The term memory may include the memory 110, a ROM and a RAM inside the processor 120, or a memory card mounted on the electronic apparatus 100 (e.g., a micro SD card, a memory stick).

In the memory 110, information on an artificial intelligence model including a plurality of layers may be stored. Here, the artificial intelligence model stored in the memory 110 may be a generic-purpose artificial intelligence model, or it may be a dedicated artificial intelligence model that compressed a generic-purpose artificial intelligence model. Specifically, in the memory 110, information on a generic-purpose artificial intelligence model, a dedicated artificial intelligence model, or a compression parameter of a dedicated artificial intelligence model, etc. may be stored.

Also, in the memory 110, learning data that trains a generic-purpose artificial intelligence model may be stored. Specifically, in the memory 110, information on a learning data set that trained a dedicated artificial intelligence model may be stored. Here, the learning data set and the information on the dedicated artificial intelligence model trained by the learning data set may be stored in the memory 110 in a corresponding manner.

In addition, in the memory 110, a rule for selecting a learning data set to train a dedicated artificial intelligence model in learning data may be stored.

Further, in the memory 110, an artificial intelligence model compression module 111 for compressing an artificial intelligence model and a learning data reconstitution module 112 for reconstituting learning data according to compression of an artificial intelligence model may be stored.

The artificial intelligence model compression module 111 may compress a generic-purpose artificial intelligence model or a dedicated artificial intelligence model stored in the memory 110 and generate another dedicated artificial intelligence model, and provide the model.

Specifically, the artificial intelligence model compression module 111 may generate a dedicated artificial intelligence model by compressing an artificial intelligence model by using a data compression algorithm. Here, the artificial intelligence model compression module 111 may apply different compression algorithms to each layer of an artificial intelligence model.

The artificial intelligence model compression module 111 may compress an artificial intelligence model by using data compression algorithms such as a low rank approximation algorithm like matrix factorization, non-negative matrix factorization, singular value decomposition, and eigen value decomposition, a pruning algorithm, and a quantization algorithm.

An SVD algorithm is an algorithm that decomposes a matrix into a specific structure and thereby reduces the size of the matrix. An SVD algorithm may decompose a matrix M by expressing the matrix M as a multiplication of matrices U, Σ, and V*as below in Equation 1.

$$M = U\Sigma V^* \quad \text{[Equation 1]}$$

In Equation 1, M is a matrix in a size of m×n, U is an orthogonal matrix (unitary matrix) in a size of m×m, V is an orthogonal matrix (unitary matrix) in a size of n×n, and V* is a conjugate transpose matrix of V. Also, Σ is a diagonal matrix which has a size of m×n, and wherein the values of elements on a diagonal line are not negative numbers and the values of all the remaining elements are 0.

M is a matrix corresponding to weight data included in one layer of an artificial neural network, and one layer may include at least one M.

That is, the artificial intelligence model compression module 111 may perform compression by expressing M corresponding to weight data included in one layer as a multiplication of a plurality of matrices U, Σ, and V*.

In the case of using a singular value decomposition (SVD) algorithm, the artificial intelligence model compression module 111 may sequentially compress an artificial intelligence model while changing the value of the rank.

Specifically, the artificial intelligence model compression module 111 may determine Σ according to the input value of the rank. Here, the rank is a parameter that determines a compression rate of an artificial intelligence model, and it indicates the number of elements having values that are not 0 among the elements of Σ. The artificial intelligence model compression module 111 may make the values of the remaining elements 0 excluding only the elements in the rank number in big sizes among values that are not negative numbers among the elements of Σ. For example, in case the value of the rank is 64, the artificial intelligence model compression module 111 may determine Σ by making the remaining values 0 excluding only the higher 64 elements in big sizes among the values that are not negative numbers included in Σ. Here, the size of Σ may be 64×64.

Then, the artificial intelligence model compression module 111 may determine the sizes of U and V* based on the size of Σ.

Figure 3A:
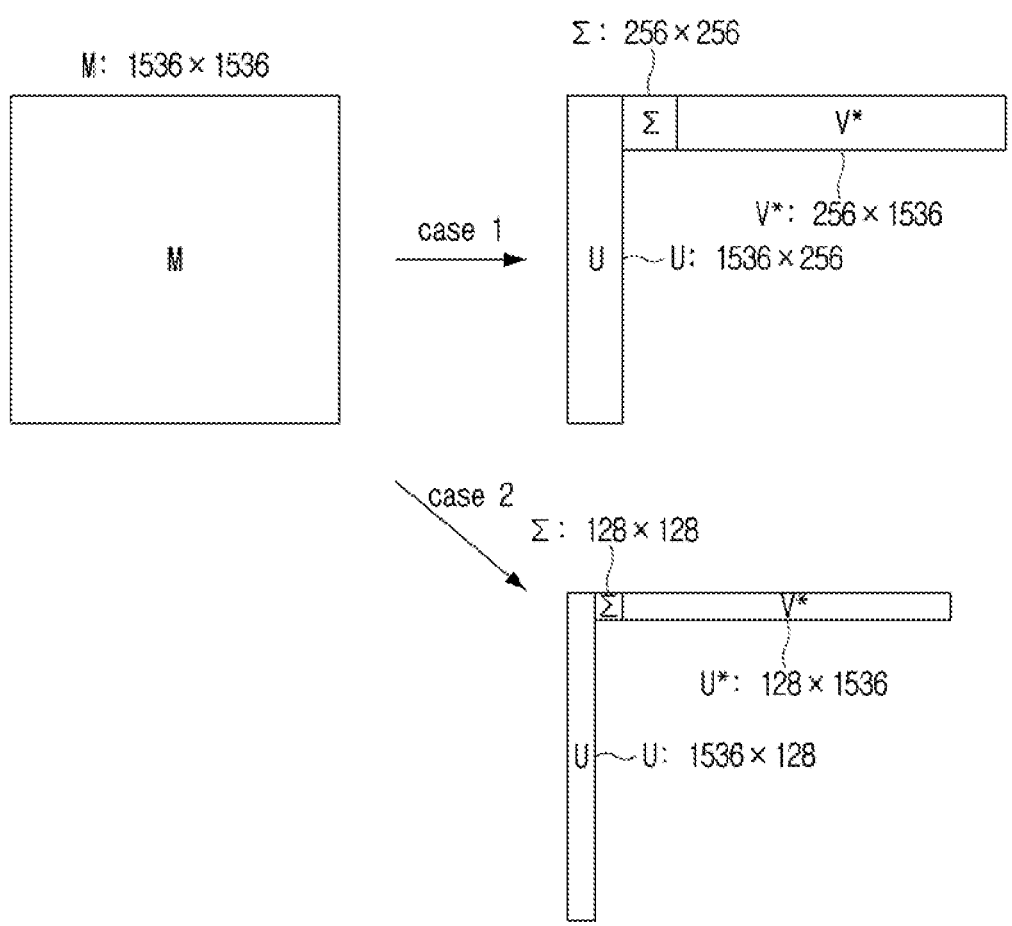
FIG. 3A is a diagram showing compression of an artificial intelligence model using an SVD algorithm according to an embodiment.

FIG. 3A is a diagram for illustrating in more detail an SVD algorithm that determines the sizes of U and V* based on the size of Σ according to an embodiment.

As illustrated in FIG. 3A, in case it is assumed that M is a matrix in a size of 1536×1536 and the rank is 256 (case 1), the size of Σ may be 256×256, the size of U may be 1536×256, and the size of V* may be 256×1536, as described above. In this case, a multiplication of the matrices U, Σ, and V* generated by the SVD algorithm has a size of (1536×256)+(256×256)+(256×1536)(=851,968), and thus the size may be a smaller size than M (1536×1536=2,359,296).

In case it is assumed that M is a matrix in a size of 1536×1536 and the rank is 128 (case 2), the size of Σ may be 128×128, the size of U may be 1536×128, and the size of V* may be 128×1536, as described above. In this case, a multiplication of the matrices U, Σ, and V* generated by the SVD algorithm has a size of (1536×128)+(128×128)+(128×1536)(=409,600), and thus the size may be a smaller size than M (1536×1536=2,359,296).

In FIG. 3A, it was illustrated that several compression matrices are generated according to the rank value in the matrix M, but the disclosure is not necessarily limited thereto.

Depending on cases, a compression matrix may be generated as the SVD algorithm is reapplied to a compression matrix compressed by using the SVD algorithm. For example, a compression matrix of which rank value is 128 may be generated as the SVD algorithm is applied to a compression matrix of which rank value was compressed to 256.

As described above, the artificial intelligence model compression module 111 may sequentially and repetitively compress an artificial intelligence model by changing the value of the rank of the SVD algorithm. Here, as the value of the rank becomes lower, the compression rate becomes bigger, and thus the artificial intelligence model compression module 111 may sequentially and repetitively reduce the size of the artificial intelligence model while sequentially making the value of the rank lower.

In FIG. 3A, only a case wherein compression is performed for one matrix M is shown, but the artificial intelligence model compression module 111 may perform compression for a plurality of Ms included in one layer.

Figure 3B:
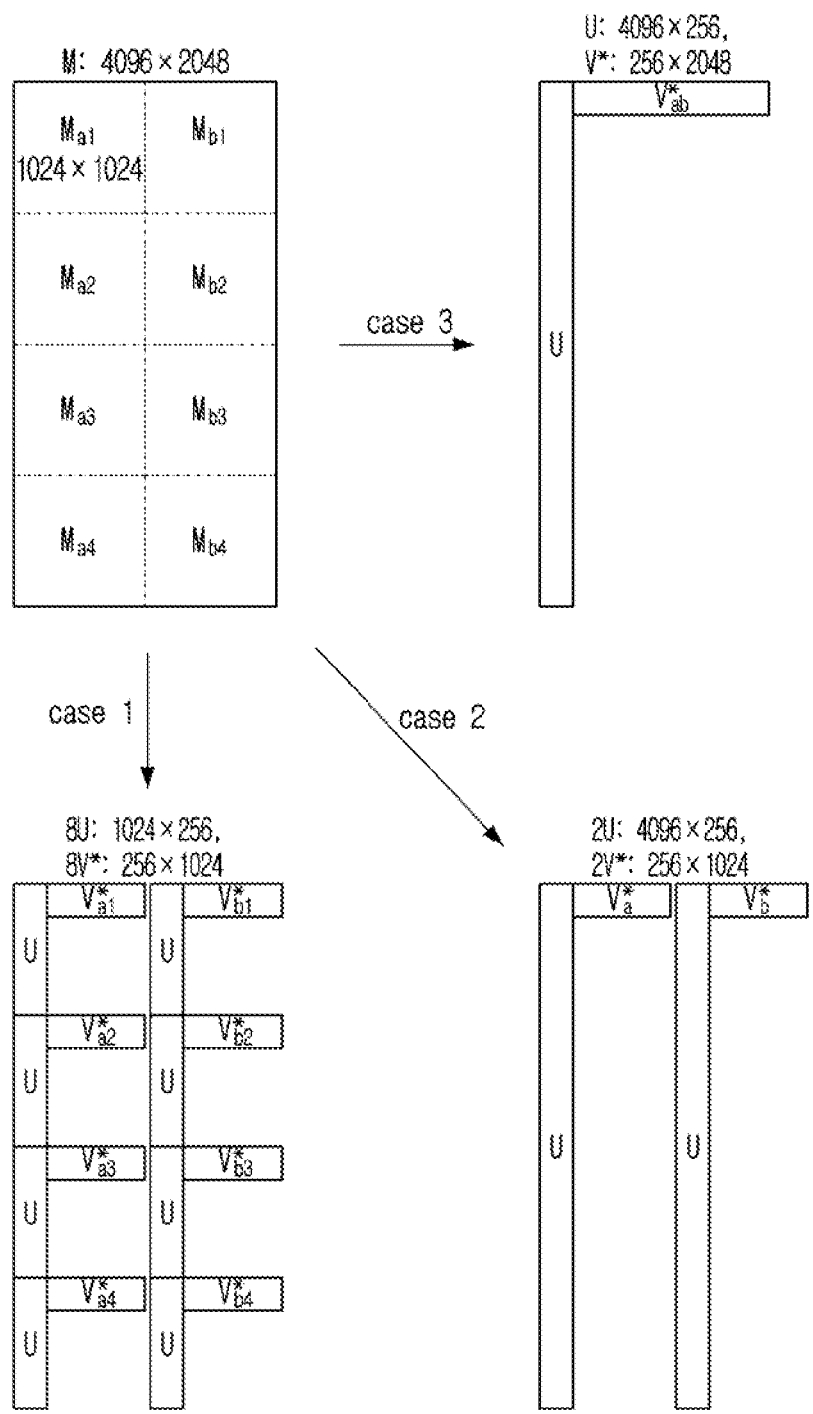
FIG. 3B is a diagram showing compression of an artificial intelligence model using an SVD algorithm according to an embodiment.

FIG. 3B is a diagram for illustrating a case wherein compression is performed for a plurality of matrices M according to an embodiment. As described above, one layer included in an artificial intelligence model may include at least one M. $M_{a1}$, $M_{a2}$, $M_{a3}$, $M_{a4}$, $M_{b1}$, $M_{b2}$, $M_{b3}$, and $M_{b4}$ in FIG. 3B indicate a plurality of Ms included in one layer of an artificial intelligence model. In FIG. 3B, description regarding Σ was omitted for the convenience of explanation.

As described above in FIG. 3A, the artificial intelligence model compression module 111 may compress an artificial intelligence model by applying the SVD algorithm for one M. In this case, if it is assumed that the value of the rank for each M of which size is 1024×1024 (=8,388,608) is 256, the size of U may be 1024×256, and the size of V may be 256×1024. Also, the size of a layer compressed by applying the SVD (the size of Σ was omitted for the convenience of explanation) is 8×(1024×256)+8×(256×1024) (=4,194,304), and thus it can be figured out that the size was reduced more than the size of M, 1024×1024 (=8,388,608).

The artificial intelligence model compression module 111 may apply the SVD algorithm by combining a plurality of matrices.

Specifically, the artificial intelligence model compression module 111 may select a plurality of Ms to which the SVD algorithm will be applied among a plurality of Ms included in one layer based on the feature of M.

For example, the artificial intelligence model compression module 111 may determine that $M_{a1}$, $M_{a2}$, $M_{a3}$, and $M_{a4}$ among $M_{a1}$, $M_{a2}$, $M_{a3}$, $M_{a4}$, $M_{b1}$, $M_{b2}$, $M_{b3}$, and $M_{b4}$ have common features, and combine $M_{a1}$, $M_{a2}$, $M_{a3}$, and $M_{a4}$ ($M_a$) and apply the SVD algorithm, and determine that $M_{b1}$, $M_{b2}$, $M_{b3}$, and $M_{b4}$ have common features, and combine $M_{b1}$, $M_{b2}$, $M_{b3}$, and $M_{b4}$ ($M_b$) and apply the SVD algorithm (case 2). In this case, the artificial intelligence model compression module 111 may apply the SVD algorithm to each of $M_a$ and $M_b$ in a size of 4096×1024. In case the rank for each M was set as 256, the artificial intelligence model compression module 111 may generate U in a size of 1024×256, and V in a size of 256×1024 for each M. In this case, the size of the compressed layer is 2×(1024×256)+2×(256×1024) (=1,835,008), and thus it can be figured out that the size was reduced more than the original size of M and the case of the case 1.

In the case 2, it is shown that the artificial intelligence model compression module 111 combined ($M_{a1}$, $M_{a2}$, $M_{a3}$, and $M_{a4}$) and ($M_{b1}$, $M_{b2}$, $M_{b3}$, and $M_{b4}$), but the disclosure is not necessarily limited thereto, and the artificial intelligence model compression module 111 may combine a plurality of Ms in various forms. For example, the artificial intelligence model compression module 111 can obviously combine $M_{a1}$, $M_{a2}$, $M_{b1}$, and $M_{b2}$ as one M, and combine $M_{a3}$, $M_{a4}$, $M_{b3}$, and $M_{b4}$ as another M.

As another example, the artificial intelligence model compression module 111 may combine all of the plurality of $M_{a1}$, $M_{a2}$, $M_{a3}$, $M_{a4}$, $M_{b1}$, $M_{b2}$, $M_{b3}$, and $M_{b4}$ (M) included in one layer and apply the SVD algorithm (case 3). In case it is assumed that the rank of the SVD algorithm is 256, the artificial intelligence model compression module 111 may generate one U in a size of 4096×256 and one V in a size of 256×2048. In this case, the size of the compressed layer is (4096×256)+(256×2048) (=1,572,864), and thus it can be figure out that the size was reduced more than the original size of M, and the cases of the case 1 and the case 2.

As described above, the artificial intelligence model compression module 111 may compress an artificial intelligence model while changing the rank for one matrix M (FIG. 3A), or compress an artificial intelligence model while varying the sizes of a plurality of Ms combined (FIG. 3B).

The artificial intelligence model compression module 111 may determine a compression parameter for an artificial intelligence model, and compress and train the artificial intelligence model according to the determined compression parameter.

Specifically, the artificial intelligence model compression module 111 may determine 'a layer compression parameter' for each layer of an artificial intelligence model, 'a unit compression parameter' indicating the compression order of each layer, 'a compression method parameter' indicating the compression method, and 'a compression rate parameter' indicating the compression rate. Here, 'the layer compression parameter' may include 'the unit compression parameter,' and 'the unit compression parameter' may include 'the compression method parameter' and 'the compression rate parameter.' With respect to the compression rate parameter, in a low rank approximation algorithm such as matrix factorization, non-negative matrix factorization, singular value decomposition, and eigen value decomposition, information for the rank or at least one M combined among a plurality of Ms included in one layer may be the compression rate parameter. In the case of a pruning algorithm, a pruning ratio, a pruning structure, or a pruning unit may be the compression rate parameter, and in the case of a quantization algorithm, a quantization method (linear, non-linear, vector quantization, lattice quantization, etc.) or the number of quantized bits may be the compression rate parameter.

For example, in an artificial intelligence model including n layers, in case the artificial intelligence model compression module 111 decided to compress the artificial intelligence model by using the SVD algorithm (rank=100) with the third layer as the first rank, 'the layer compression parameter' may be the third layer, 'the unit compression parameter' may be 1, 'the compression method parameter' may be the SVD, and 'the compression rate parameter' may be 100. Also, in case the artificial intelligence model compression module 111 decided to compress the artificial intelligence model by using the vector quantization algorithm (the number of bits is 4) with the first layer as the second rank, 'the layer compression parameter' may be the first layer, 'the unit compression parameter' may be 2, 'the compression method parameter' may be the vector quantization, and 'the compression rate parameter' may be 4. The disclosure is not necessarily limited thereto, and types and values of parameters may be diverse depending on embodiments.

It is described above that the layer compression parameter, the unit compression parameter, the compression method parameter, and the compression rate parameter are layered structures, but the disclosure is not necessarily limited thereto, and each parameter may be parallel data as separate parameters.

The artificial intelligence model compression module 111 may perform compression for an artificial intelligence model, and then train the generated artificial intelligence model. Specifically, the artificial intelligence model compression module 111 may train a compressed artificial intelligence model by using learning data or a learning data set reconstituted from the learning data.

Then, the artificial intelligence model compression module 111 may determine whether to additionally compress the artificial intelligence model. Specifically, the artificial intelligence model compression module 111 may test the artificial intelligence model trained by using test data and determine the performance of the artificial intelligence model, and determine whether to additionally compress the artificial intelligence model.

For example, in a case where the performance of the compressed artificial intelligence model is higher than or equal to a predetermined value (e.g., a second threshold value), the artificial intelligence model compression module 111 may additionally perform compression for the artificial intelligence model.

However, in case the performance of the compressed artificial intelligence model is higher than or equal to a first threshold value and lower than or equal to a second threshold value, the artificial intelligence model compression module 111 may stop compression for the artificial intelligence model. The standard for performance of an artificial intelligence model is merely an embodiment, and the artificial intelligence model compression module 111 may stop compression for an artificial intelligence model in a case where the performance of the artificial intelligence model is lower than or equal to the predetermined value.

The learning data reconstitution module 112 may reconstitute learning data. Specifically, the learning data reconstitution module 112 may be a module for reconstituting learning data in a case where performance for an artificial intelligence model became lower than or equal to a threshold value and compression for the artificial intelligence model was stopped.

The learning data reconstitution module 112 may reconstitute learning data by using a prestored rule. Here, the rule means a rule for an initial artificial intelligence model or a compressed artificial intelligence model to extract specific data from learning data that it learned.

As an example of the rule, the learning data reconstitution module 112 may extract feature information of learning data, and classify the learning data into a plurality of learning data sets based on the extracted feature information. Here, the feature information of the learning data means the feature vectors of the learning data, and specifically, it may mean indicating elements having a specific pattern or rule among a plurality of elements included in the learning data as vectors.

Then, the learning data reconstitution module 112 may reconstitute the learning data by selecting at least one learning data set among the plurality of classified learning data sets. The learning data reconstitution module 112 may reconstitute the learning data by selecting a plurality of learning data sets of which feature vector values are adjacent. However, this is merely an embodiment, and a plurality of learning data sets may be combined according to various standards. For example, the learning data reconstitution module 112 may reconstitute the learning data by selecting learning data sets corresponding to target data input as an input value of an operation (or inference) into the electronic apparatus 100.

As another example of the rule, the learning data reconstitution module 112 may reconstitute the learning data sets based on a result of testing the artificial intelligence model compressed by using test data. Here, the test data indicates data which has common feature information with the learning data, but which is different data from the learning data.

Specifically, the learning data reconstitution module 112 may classify the test data into a plurality of test data sets based on a result that the artificial intelligence model compression module 111 tested the artificial intelligence model for determining the performance of the artificial intelligence model. For example, based on whether the artificial intelligence model output a target value as a result value for an input value, the learning data reconstitution module 112 may classify the test data sets into a test data set that output the target value, a test data set adjacent to the target value, and a test data set that did not reach the target value.

The learning data reconstitution module 112 may reconstitute the learning data by using the test data set that output the target value and the test data set adjacent to the target value, excluding the test data set that did not reach the target value. Specifically, the learning data reconstitution module 112 may reconstitute the learning data sets by selecting learning data sets corresponding to the test data set that output the target value and the test data set adjacent to the target value in the learning data.

As still another example of the rule, the learning data reconstitution module 112 may reconstitute the learning data sets based on a user's input. The electronic apparatus 100 may receive learning data setting information from a user, and the learning data reconstitution module 112 may reconstitute the learning data sets by using the learning data setting information received from a user.

For example, in a case where a user who wants a 'machine translation at a messenger' service and inputs 'machine translation for a messenger' as learning data setting information, the learning data reconstitution module 112 may reconstitute the learning data sets by selecting learning data for machine translating a term or a short sentence used in a messenger.

As described above, the learning data reconstitution module 112 may reconstitute learning data by using a prestored rule.

The processor 120 may be electronically connected with the memory 110 and control the overall operations and functions of the electronic apparatus 100. For example, the processor 120 may operate an operating system or an application program and control hardware or software components connected to the processor 120, and perform various kinds of data processing and operations. Also, the processor 120 may load instructions or data received from at least one of other components on a volatile memory and process them, and store various data in a non-volatile memory.

For this, the processor 120 may be implemented as a generic-purpose processor (e.g.: a central processing unit (CPU) or an application processor) that can perform operations by executing a dedicated processor (e.g., an embedded processor) or one or more software programs stored in a memory device for performing the operations.

The processor may consist of one or a plurality of processors. The one or plurality of processors may be generic-purpose processors such as a central processing unit (CPU), an application processor (AP), a digital signal processor (DSP), etc., graphics-dedicated processors such as a graphics-processing unit (GPU) and a vision processing unit (VPU), or artificial intelligence-dedicated processors such as a numeric processing unit (NPU).

The processor 120 may be implemented as a digital signal processor (DSP) processing digital signals, a microprocessor, and a time controller (T-CON). However, the disclosure is not limited thereto, and the processor 120 may include one or more of a central processing unit (CPU), a micro controller unit (MCU), a micro processing unit (MPU), a controller, an application processor (AP), a graphics-processing unit (GPU) or a communication processor (CP), and an ARM processor, or may be defined by the terms. Also, the processor 120 may be implemented as a system on chip (SoC) having a processing algorithm stored therein or large scale integration (LSI), or in the form of a field programmable gate array (FPGA).

The one or plurality of processors may perform control such that input data is processed according to a predefined operation rule or an artificial intelligence model stored in the memory 110. Alternatively, in case the one or plurality of processors are artificial intelligence-dedicated processors, the artificial intelligence-dedicated processors may be designed as a hardware structure specified for processing of a specific artificial intelligence model.

A predefined operation rule or an artificial intelligence model is characterized in that it is made through learning. Being made through learning may mean that a basic artificial intelligence model is trained by using a plurality of learning data by a learning algorithm, and a predefined operation rule or an artificial intelligence model set to perform a desired characteristic (or, purpose) is made. Such learning may be performed in a device wherein artificial intelligence is performed itself, or performed through a separate server and/or system. As examples of learning algorithms, there are supervised learning, unsupervised learning, semi-supervised learning, or reinforcement learning, but learning algorithms are not limited to the aforementioned examples.

The processor 120 may load the artificial intelligence model compression module 111 and the learning data reconstitution module 112 from a non-volatile memory to a volatile memory. The non-volatile memory refers to a memory that can maintain the stored information even if power supply is stopped (e.g., a flash memory, a programmable read-only memory (PROM), a magnetoresistive random-access memory (MRAM), and a resistive RAM (RRAM)). Meanwhile, the volatile memory refers to a memory that needs constant power supply for maintaining the stored information (e.g., a dynamic random-access memory (DRAM) and a static RAM (SRAM)). Also, loading means an operation of calling in data stored in the non-volatile memory to the volatile memory and storing the data, so that the processor 120 can access the data. The non-volatile memory may be included in the processor 120, or it may be implemented as a separate component from the processor 120 depending on embodiments.

The processor 120 may generate a compressed artificial intelligence model (a dedicated artificial intelligence model) by using the artificial intelligence model compression module 111 stored in the memory 110. Specifically, the processor 120 may generate dedicated artificial intelligence models in various sizes in a generic-purpose artificial intelligence model by using the artificial intelligence model compression module 111. The generated dedicated artificial intelligence models may be artificial intelligence models having a smaller size than the generic-purpose artificial intelligence model, and the size of data related to a plurality of connections (weight value connections) included in the dedicated artificial intelligence models may be smaller than the size of data related to connections among a plurality of nodes included in the generic-purpose artificial intelligence model.

The processor 120 may acquire a learning data set reconstituted by using the learning data reconstitution module 112 stored in the memory 110.

The processor 120 may generate dedicated artificial intelligence models in various sizes by repeating the processes of compressing and training an artificial intelligence model, and reconstituting a learning data set by using the artificial intelligence model compression module 111 and the learning data reconstitution module 112.

Figure 4:
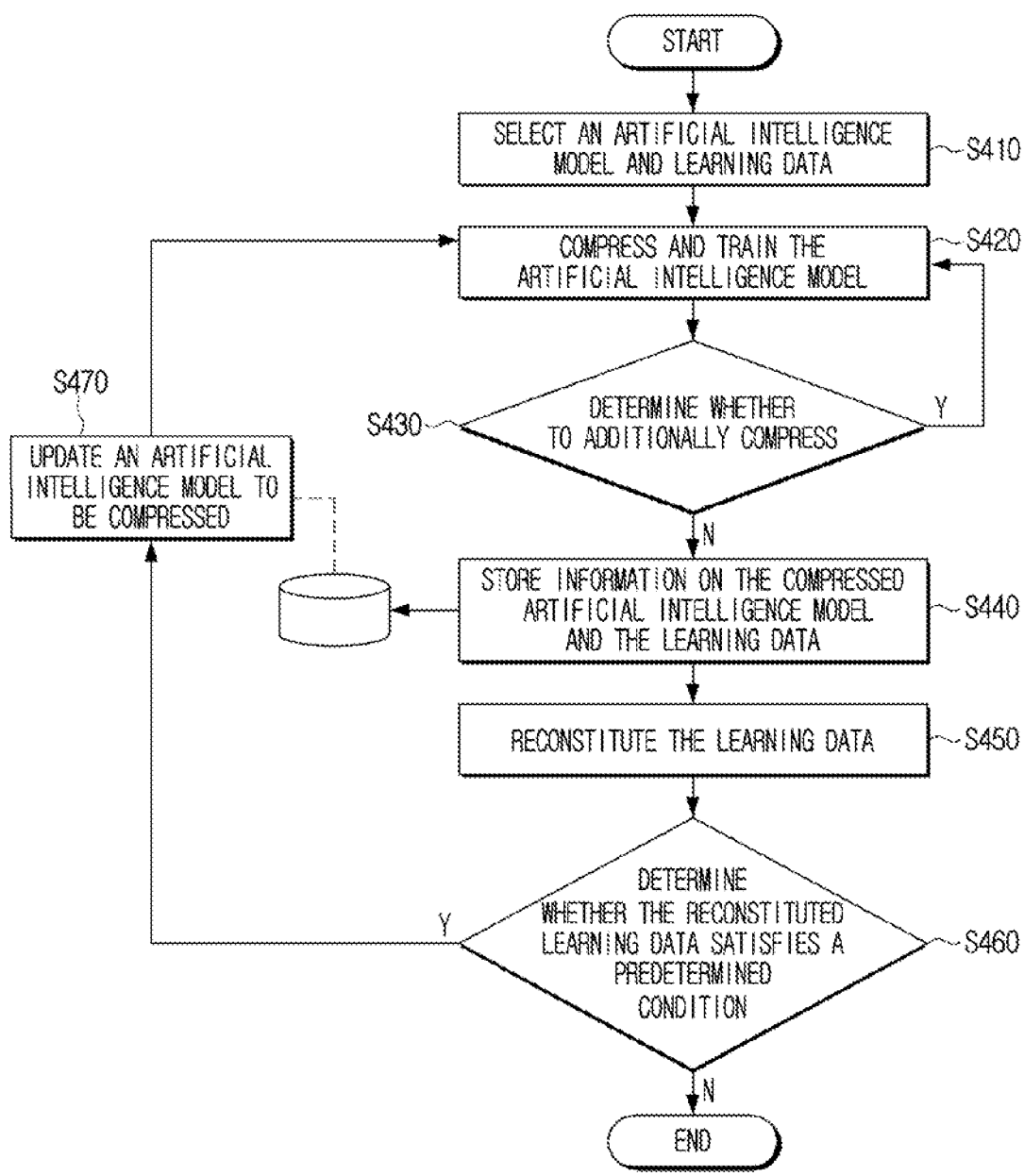
FIG. 4 is a flow chart of an operation of an electronic apparatus according to an embodiment.
Figure 5:
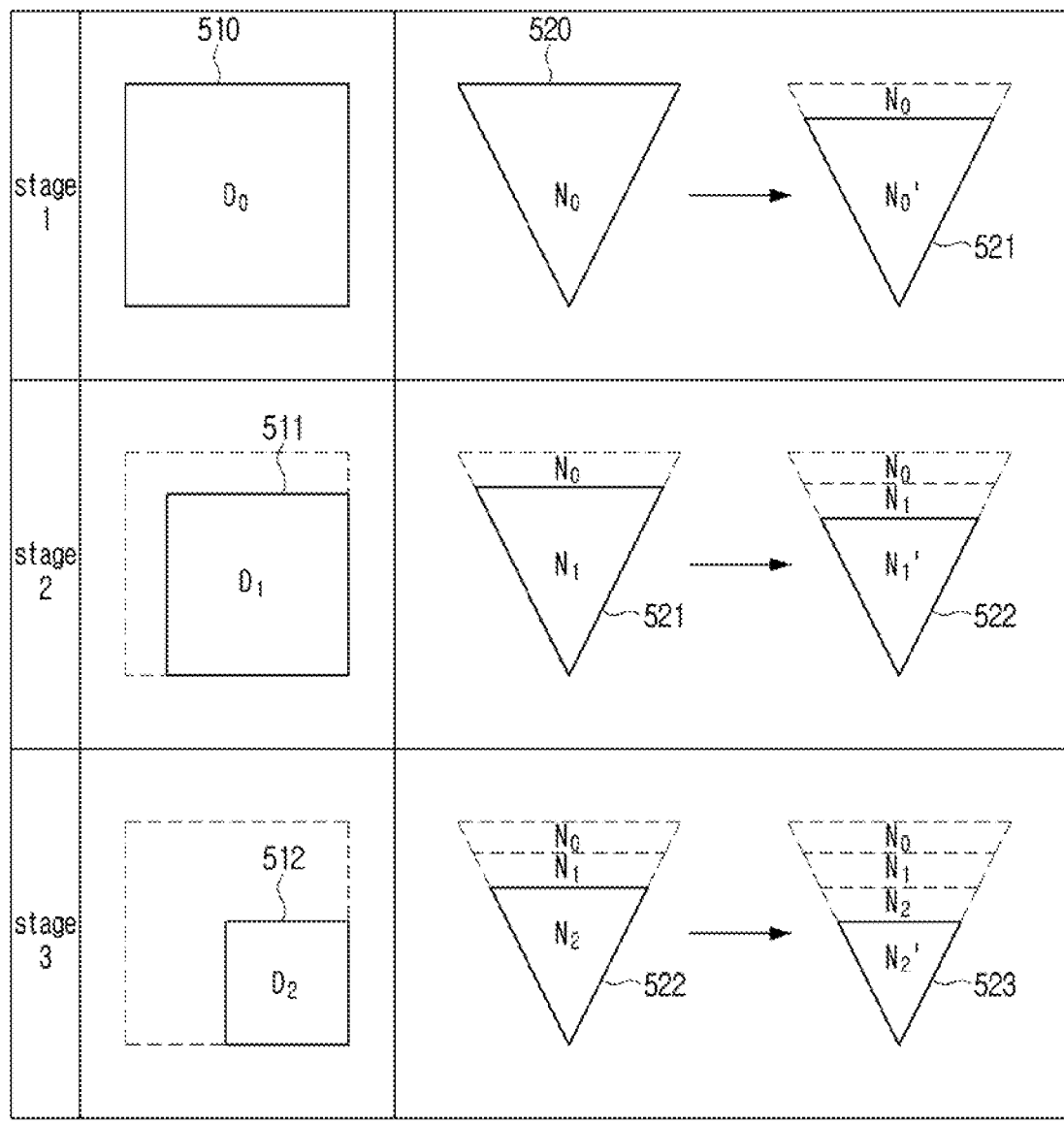
FIG. 5 is a diagram showing a learning data set reconstituted from learning data and a plurality of dedicated artificial intelligence models generated from one artificial intelligence model according to an embodiment.

In this regard, FIG. 4 is a flow chart of a method of compressing an training an artificial intelligence model according to various embodiments of the disclosure, and FIG. 5 is a diagram showing a learning data set reconstituted from learning data and a plurality of dedicated artificial intelligence models generated from one artificial intelligence model according to an embodiment of the disclosure.

As described above in FIG. 2, in the memory 110, at least one trained artificial intelligence model and learning data used for training the artificial intelligence model may be stored.

The processor 120 may select the at least one artificial intelligence model and the learning data corresponding to the artificial intelligence model stored in the memory 110 in operation S410. Here, the selected artificial intelligence model may be a generic-purpose artificial intelligence model or a dedicated artificial intelligence model which was generated by being compressed from a generic-purpose artificial intelligence model.

The processor 120 may generate a dedicated artificial intelligence model by using the selected artificial intelligence model.

For generating a dedicated artificial intelligence model, the processor 120 may compress the selected artificial intelligence model, and train the compressed artificial intelligence model by using learning data in operation S420.

More specifically, the processor 120 may determine a compression parameter related to the size of a dedicated artificial intelligence model to be generated by using the artificial intelligence model compression module 111. The processor 120 may determine a layer compression parameter, a unit compression parameter, a compression method parameter, and a compression rate parameter for each layer included in the selected artificial intelligence model. Based on the determined parameters, the processor 120 may reduce the size of data related to connections among a plurality of nodes included in the selected artificial intelligence model and compress the selected artificial intelligence model. Then, the processor 120 may train the selected artificial intelligence model by using the learning data.

The processor 120 may compress and train the selected artificial intelligence model at least more than once.

For this, the processor 120 may train the selected artificial intelligence model, and then determine whether to additionally compress the artificial intelligence model in operation S430. Specifically, the processor 120 may determine whether to additionally compress the compressed artificial intelligence model based on the performance of the compressed artificial intelligence model.

Specifically, the processor 120 may compress the selected artificial intelligence model by using the artificial intelligence model compression module 111, and in case the performance of the compressed artificial intelligence model compressed by using the selected learning data exceeds a predetermined threshold value, the processor 120 may repetitively compress and train the selected artificial intelligence model until the performance of the artificial intelligence model becomes lower than or equal to the predetermined threshold value.

In case the performance of the artificial intelligence model becomes lower than or equal to the predetermined threshold value, that is, in case it is determined that recompression for the selected artificial intelligence model is not to be performed, the processor 120 may determine the compressed artificial intelligence model as a dedicated artificial intelligence model for the learning data. Then, the processor 120 may store information on the compressed artificial intelligence model (a dedicated artificial intelligence model) and information on the learning data in the memory 110 in operation S440. Here, the information on the compressed artificial intelligence model may include the size of the compressed artificial intelligence model and the compression parameter. Also, the information on the learning data may include the feature information of the learning data used for training the compressed artificial intelligence model.

In this regard, referring to FIG. 5, the processor 120 may select the learning data $D_0$ 510 and the artificial intelligence model $N_0$ 520 stored in the memory 110, and compress the artificial intelligence model $N_0$ 520, and then train the compressed artificial intelligence model by using the learning data $D_0$ 510. Here, in case the performance of the compressed artificial intelligence model exceeds the predetermined threshold value, the processor 120 may repetitively compress and train the selected artificial intelligence model until the performance of the artificial intelligence model becomes lower than or equal to the predetermined threshold value. Then, the processor 120 may determine that recompression for the selected artificial intelligence model $N_0$ for which the performance of the compressed artificial intelligence model $N_0'$ becomes lower than or equal to the predetermined threshold value should no longer be performed, and stop recompression. In this case, the processor 120 may determine the compressed artificial intelligence model $N_0'$ as a dedicated artificial intelligence model for the learning data $D_0$. Then, the processor 120 may store information on the compressed artificial intelligence model (i.e., a dedicated artificial intelligence model) $N_0'$ 521 (information on the size of $N_0'$ and the compression parameter) and information on the learning data in this regard (the feature information of the learning data that trained $N_0'$) in the memory 110.

Referring to FIG. 4, the processor 120 may store information on the compressed artificial intelligence model and the learning data in the memory 110 in operation S440, and then reconstitute the learning data in operation S450.

Specifically, the processor 120 may classify the learning data into a plurality of data sets by using the learning data reconstitution module 112, and select some of the plurality of classified learning data sets based on the predetermined rule. As the specific method for reconstituting the learning data was described above in FIG. 2, overlapping explanation will be omitted.

The processor 120 may determine whether the reconstituted learning data satisfies a predetermined condition in operation S460. The predetermined condition may indicate the size of the learning data. That is, the processor 120 may determine whether the size of the reconstituted learning data is greater than or equal to a predetermined size.

Then, in case the reconstituted learning data satisfies the predetermined condition in operation S460—Y, the processor 120 may update the artificial intelligence model to be compressed in operation S470. For example, in case the size of the selected learning data set is greater than or equal to the predetermined size, the processor 120 may update the artificial intelligence model to be compressed. Here, the processor 120 may update one of the dedicated artificial intelligence models stored in the memory 110 to a compressed artificial intelligence model.

Then, the processor 120 may compress the updated artificial intelligence model (i.e., a dedicated artificial intelligence model), and train the compressed artificial intelligence model by using the learning data reconstituted in the operation S450 in operation S420.

That is, in case the learning data set selected in the operation S450 satisfies the predetermined condition, for example, in case the size of the selected learning data set is greater than or equal to the predetermined value, the processor 120 may train the dedicated artificial intelligence model by using the selected learning data set.

The processor 120 may repetitively compress the dedicated artificial intelligence model at least more than once, and train the compressed dedicated artificial intelligence model by using the selected learning data set.

In this regard, referring to FIG. 5, the processor 120 may select one learning data set $D_1$ 511 among a plurality of learning data sets included in the learning data $D_0$ according to the predetermined rule and reconstitute the learning data,' and update the dedicated artificial intelligence model $N_0$' 521 generated in the previous step to an artificial intelligence model to be compressed $N_1$ 521. The processor 120 may repetitively compress the artificial intelligence model $N_1$ 521 at least more than once and train the artificial intelligence model compressed from the artificial intelligence model $N_1$ 521 by using the learning data set $D_1$ 511. The processor 120 may compress the compressed artificial intelligence model until the performance of the compressed artificial intelligence model compressed based on the artificial intelligence model $N_1$ 521 and trained with the data set $D_1$ becomes lower than or equal to the predetermined threshold value and generate a dedicated artificial intelligence model $N_1$' 522.

Afterwards, through the same process as the aforementioned process, the processor 120 may select one learning data set $D_2$ 512 among the plurality of learning data sets included in the learning data $D_0$ according to the predetermined rule and reconstitute the learning data, and generate a dedicated artificial intelligence model $N_2$'.

As described above, based on the initial learning data $D_0$ 510 and the initial network model $N_0$ 520, the processor 120 may generate dedicated artificial intelligence models 521, 522, 523 in various sizes. The processor 120 may compress the initial network model $N_0$ 520 by stages, and reconstitute the initial learning data $D_0$ by stages, and generate dedicated artificial intelligence models 521, 522, 523 in various sizes by stages.

As the operations after generating a dedicated artificial intelligence model by compressing an artificial intelligence model are identical to those in the aforementioned steps S440, S450, and S470, overlapping explanation will be omitted.

As described above, the processor 120 may generate a plurality of dedicated artificial intelligence models by compressing a generic-purpose artificial intelligence model by stages and repetitively, and training the compressed artificial intelligence model with a learning data set. The processor 120 may store information on the dedicated artificial intelligence models generated by compressing a generic-purpose artificial intelligence model by stages and repetitively and information on the learning data set in the memory 110.

FIG. 6 is a diagram for illustrating information on a dedicated artificial intelligence model and information on a learning data set stored in the memory 110 according to an embodiment.

As a dedicated artificial intelligence model is generated by stages, the processor 120 may map information on a learning data set used for training the dedicated artificial intelligence model and map information on the dedicated artificial intelligence model, and store the information by stages.

Here, the information on the learning data set may include feature information of the learning data set. Here, the feature information of the learning data set means the feature vectors of the learning data used for training the dedicated artificial intelligence model, and specifically, it may mean indicating elements having a specific pattern or rule among a plurality of elements included in the learning data set as vectors. For example, in the case of learning data of a voice recognition model, 'a noisy environment,' 'a quiet environment without a noise,' 'a sound source in a far distance,' 'a sound source in a close distance,' 'dictation wherein a lot of words are needed,' 'a voice command wherein a large amount of words are needed,' etc. may be the feature information of the learning data set.

The information on the dedicated artificial intelligence model may be the size of the dedicated artificial intelligence model, and the compression parameter of the dedicated artificial intelligence model. Depending on embodiments, the generated dedicated artificial intelligence model itself may be stored in the memory 110, as well as the information on the dedicated artificial intelligence model.

As shown in FIG. 6, in case meta data regarding information on a learning data set and information on a dedicated artificial intelligence model is set as data description including a compression parameter and data feature information, the processor 120 may store feature information of a learning data set used for training a dedicated artificial intelligence model and a compression parameter used for generating a dedicated artificial intelligence model whenever a dedicated artificial intelligence model is generated by stages.

For example, in case learning data that trained an artificial intelligence model compressed by applying a rank R0 to the SVD algorithm is $D_0$, the processor 120 may map the compression parameter rank R0 and the learning data feature information $D_0$ and store them in the memory 110. Also, in case learning data that trained an artificial intelligence model compressed by applying a rank R1 to the SVD algorithm is $D_1$, the processor 120 may map the compression parameter rank R1 and the learning data feature information $D_1$ and store them in the memory 110. Likewise, in case learning data that trained an artificial intelligence model compressed by applying a rank R2 to the SVD algorithm is $D_2$, the processor 120 may map the compression parameter rank R2 and the learning data feature information $D_2$ and store them in the memory 110.

In case the degree of compression for an artificial intelligence model is big (i.e., in case the value of the rank is small), the size of a learning data set may also become small. Accordingly, as shown in FIG. 6, as the value of R becomes smaller, the amount of feature information of data included in the data description also becomes smaller.

In FIG. 6, only the compression method parameter and the compression rate parameter were shown as compression parameters, but the disclosure is not necessarily limited thereto, and it is obvious that the layer compression parameter or the unit compression parameter can be added and stored.

Returning to FIG. 2, the processor 120 may generate a dedicated artificial intelligence model based on information on dedicated artificial intelligence models in various sizes, and perform an operation by using the generated dedicated artificial intelligence model.

Specifically, in case target data is input, the processor 120 may select information on a dedicated artificial intelligence model for performing an operation for the target data among information on dedicated artificial intelligence models in various sizes, and generate a dedicated artificial intelligence model based on the selected information on a dedicated artificial intelligence model. Here, the target data means input data for performing an operation by using a trained artificial intelligence model.

More specifically, in case the target data corresponds to one learning data set is among a plurality of learning data sets included in the learning data, the processor 120 may identify information on a dedicated artificial intelligence model trained by using the learning data set corresponding to the target data. Here, the feature that the target data corresponds to a learning data set means that the feature information of the target data is identical to the feature information of the learning data set. For example, in case the feature information of the target data is 'voice data of a woman,' and the feature information of a learning data set is 'voice data of a woman,' it can be deemed that the feature information of the target data and the feature information of the learning data set correspond to each other.

For this, the processor 120 may determine the feature information of the target data, and determine the feature information of the plurality of learning data sets included in the learning data.

Then, the processor 120 may generate a dedicated artificial intelligence model based on the identified information on a dedicated artificial intelligence model, and acquire an output value for the target data by making the target data an input value of the generated dedicated artificial intelligence model.

Figure 7A:
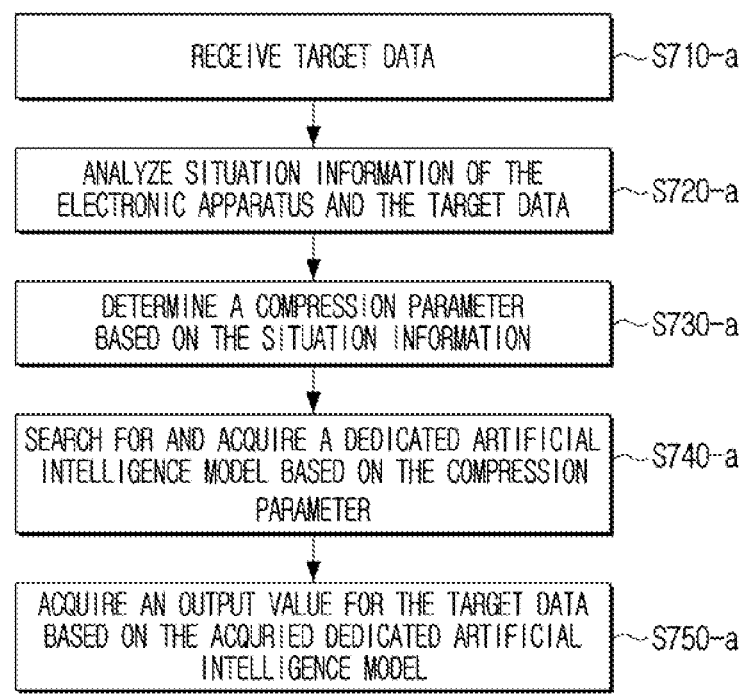
FIG. 7A is a flow chart of an operation of a dedicated artificial intelligence model according to an embodiment.

FIG. 7A is a flow chart of a process of performing an operation by using a dedicated artificial intelligence model according to an embodiment.

The processor 120 may receive target data in operation S710-*a*. Specifically, the processor 120 may receive target data from a user or an external electronic apparatus.

In case target data is input in operation S710-*a*, the processor 120 may analyze situation information for the target data in operation S720-*a*. Here, the situation information may indicate the feature information of the target data input into the electronic apparatus 100, and information on hardware or software included in the electronic apparatus into which the target data is input when the target data is input.

For example, in case a user uttered 'tell me about a route to OO bank' through the microphone of the electronic apparatus 100 (i.e., in case a user input target data), the processor 120 may analyze the voice signal, and analyze the feature information of the target data such as whether a noise is included in the user voice, whether the distance between the electronic apparatus 100 and the user is close, the sex and age of the user, etc.

Also, the processor 120 may analyze software information for operating the target data. For example, the processor 120 may identify an ID of a voice recognition model calling application, and identify the sizes of words necessary for dictation for a user's voice or a voice command. For example, in case the ID of the voice recognition model calling application corresponds to a user who mainly makes voice commands in short sentences, the processor 120 may determine that only a small amount of words are needed for dictation or a voice command. In contrast, in case the ID of the voice recognition model calling application corresponds to a user who often makes voice commands and makes various kinds of voice commands, the processor 120 may determine that a large amount of words are needed for dictation or a voice command.

In addition, the processor 120 may analyze hardware information for processing the target data. For example, the processor 120 may analyze network connection information such as WiFi, Bluetooth, etc. at the time when the target data was input, and determine whether a user is in indoors or outdoors. Also, the processor 120 may analyze sensing information such as a position sensor, an accelerometer sensor, a motion sensor, etc. included in the electronic apparatus 100, and determine whether a user is in a stopped state or a moving state.

The processor 120 may determine a compression parameter of an artificial intelligence model based on the analyzed situation information in operation S730-*a*. Specifically, the processor 120 may determine an optimal compression parameter that can operate the target data.

The processor 120 may determine a compression parameter based on information on a learning data set and information on a dedicated artificial intelligence model compressed by using the learning data set stored in the memory 110.

The processor 120 may identify information on a learning data set matched to the situation information among the information on learning data sets stored in the memory 110, and determine a compression parameter related to the identified learning data set. The processor 120 may determine a learning data set including the biggest amount of information that coincides with the situation information of the target data among the plurality of learning data sets stored in the memory 110 as a learning data set matched to the situation information, and identify a compression parameter mapped to the determined learning data set and stored in the memory 110. Depending on embodiments, in case there are a plurality of learning data sets including the biggest amount of information that coincides with the situation information of the target data among the plurality of learning data sets stored in the memory 110, the processor 120 may determine the smallest learning data set among the plurality of learning data sets as a learning data set matched to the situation information, and identify a compression parameter mapped to the determined learning data set.

For example, in case the situation information of the target data is analyzed as 'a distant sound source,' 'a clean environment without a noise,' 'a voice command using a small amount of words,' and 'dictation,' the processor 120 may identify a learning data set mapped to the situation information among the information on learning data sets stored in the memory 110. Referring to the information on learning data sets and information on dedicated artificial intelligence models shown in FIG. 6, the processor 120 may identify $D_0$ and $D_1$ as learning data sets including all the information included in the identified situation information among the information on learning data sets stored in the memory 110. The processor 120 may identify $D_1$ which is a smaller data set between $D_0$ and $D_1$ as a data set matched to the situation information. Then, the processor 120 may identify a compression parameter rank R1 mapped to the identified data set $D_1$ and stored.

The processor 120 may search for a dedicated artificial intelligence model corresponding to the compression parameter in operation S740-*a*. The processor 120 may identify a dedicated artificial intelligence model corresponding to the compression parameter among the plurality of dedicated artificial intelligence models stored in the memory 110, and load the identified dedicated artificial intelligence model.

The loaded dedicated artificial intelligence model may be a compressed artificial intelligence model having a smaller size than the generic-purpose artificial intelligence model stored in the memory 110. As described above, the processor 120 may load a dedicated artificial intelligence model having a small size and may perform an operation, and thus an operation amount for the target data can be reduced, and the processing speed can be improved, and the resources (e.g., the memory, the CPU, the GPU, etc.) of the electronic apparatus 100 are not wasted, and thus usefulness of the resources can be enhanced.

The processor 120 may acquire an output value for the target data based on the dedicated artificial intelligence model in operation S750-a. Specifically, the processor 120 may acquire output data for the target data by making the target data an input value for the dedicated artificial intelligence model acquired in the operation S740. Then, the processor 120 may provide the acquired output data to the user through an output interface (not shown) such as a display and a speaker.

The aforementioned embodiment relates to a case wherein a dedicated artificial intelligence model is stored in the memory 110.

Depending on embodiments, in case a dedicated artificial intelligence model is not stored in the memory 110, the processor 120 may generate a dedicated artificial intelligence model to which a compression parameter is reflected. In this case, the processor 120 may generate a dedicated artificial intelligence model for a compression parameter by applying a compression parameter to the artificial intelligence model stored in the memory 110.

Figure 7B:
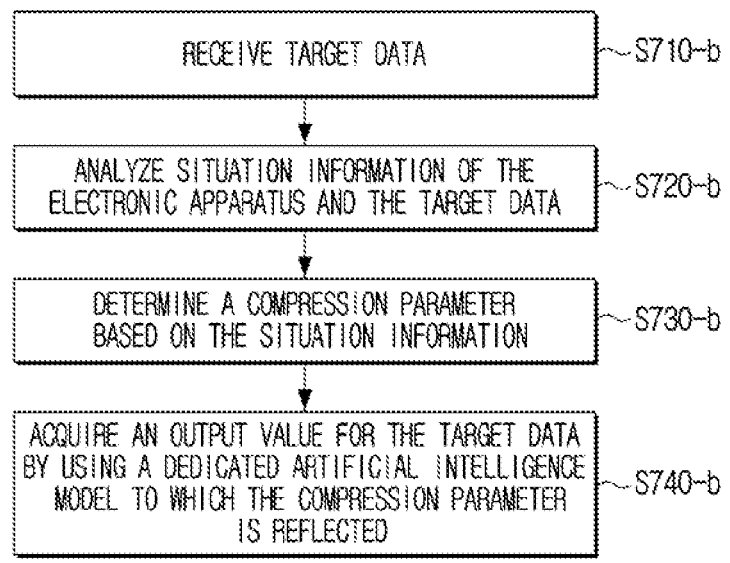
FIG. 7B is a flow chart of an operation of a dedicated artificial intelligence model according to an embodiment.

FIG. 7B is a flow chart of a process of performing an operation by using a dedicated artificial intelligence model to which a compression parameter is reflected according to an embodiment.

As the operations S710-b, S720-b, and S730-b in FIG. 7B are identical to the operations S710-a, S720-a, and S730-a in FIG. 7A, explanation about overlapping contents will be omitted.

The processor 120 may determine a compression parameter based on the situation information for the target data input into the electronic apparatus 100 in operation S730-b, and then acquire an output value for the target data by using a dedicated artificial intelligence model to which the compression parameter is reflected in operation S740-b.

Specifically, the processor 120 may load a dedicated artificial intelligence model compressed by applying a compression algorithm to the artificial intelligence is model stored in the memory 110. Here, the compression algorithm may be an algorithm wherein the compression parameter determined in the operation S730-b was applied as an input value.

For example, it is assumed that a matrix M in a size of m×n is stored in the memory 110 as information on the generic-purpose artificial intelligence model. casein a case where the compression parameter is determined based on the situation information is R1, the processor 120 may apply an SVD algorithm where the compression parameter R1 is used as an input value to the matrix M, and acquire a matrix U (a size of m×R1) and a matrix V* (a size of R1×n) which are compression matrices for the matrix M.

The processor 120 may acquire an output value for the target data by using the matrix U and the matrix V* which are compression matrices. The processor 120 may acquire an output value for the target data by making the target data as an input value of a multiplication matrix of the matrix U and the matrix V*.

As described above, the processor 120 may determine a compression parameter based on the situation information for the target data, and generate an output value for the target data by using a dedicated artificial intelligence model compressed by reflecting the determined compression parameter to the artificial intelligence model stored in the memory 110. In this case, the processor 120 may acquire an output value for an input value by performing an operation of applying a compression algorithm only once.

Embodiments where the electronic apparatus 100 performs an operation for the target data are not limited to FIG. 7A and FIG. 7B. As another embodiment, the processor 120 may load the artificial intelligence model stored in the memory 110, and generate a dedicated artificial intelligence model for the generic-purpose artificial intelligence model by using the compression parameter determined in the operation S730-a or S730-b. In this case, the processor 120 may also generate a dedicated artificial intelligence model by using an operation of applying a compression algorithm only once.

In FIG. 4 through FIG. 7, it was explained that one dedicated artificial intelligence model is generated in each step, but the disclosure is not necessarily limited thereto.

Figure 8:
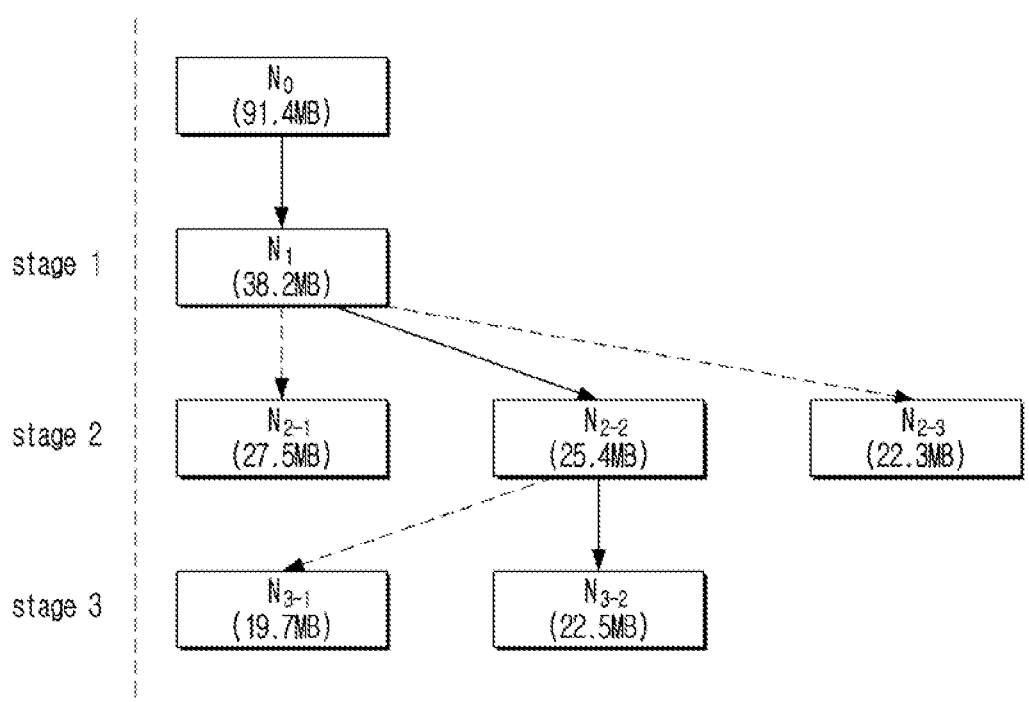
FIG. 8 is a diagram showing a process of generating a plurality of dedicated artificial intelligence models from an artificial intelligence model according to an embodiment.

FIG. 8 is a diagram showing a process of generating a plurality of dedicated artificial intelligence models from an artificial intelligence model according to an embodiment.

As shown in FIG. 8, the processor 120 may generate a plurality of dedicated artificial intelligence models in each step. Specifically, the processor 120 may generate a plurality of dedicated artificial intelligence models by selecting different learning data sets in each step.

For example, the processor 120 may generate a dedicated artificial intelligence model $N_1$ by compressing an initial artificial intelligence model $N_0$ by using the artificial intelligence model compression module 111, and training the compressed artificial intelligence model by using initial learning data $D_0$.

Then, the processor 120 may classify a plurality of learning data sets from the learning data $D_0$ by using the learning data reconstitution module 112, and select different learning data sets among the classified learning data sets and generate different dedicated artificial intelligence models. For example, the processor 120 may select a learning data set $D_{1-1}$ from the learning data $D_0$, and repetitively train the artificial intelligence model generated by repetitively compressing the dedicated artificial intelligence model $N_1$ by using the learning data set $D_{1-1}$ and generate a dedicated artificial intelligence model $N_{2-1}$. Likewise, the processor 120 may select a learning data set $D_{1-2}$ from the learning data $D_0$, and generate a dedicated artificial intelligence model $N_{2-2}$ trained by using the learning data set $D_{1-2}$, and select a learning data set $D_{1-3}$ from the learning data $D_0$, and generate a dedicated artificial intelligence model $N_{2-3}$ trained by using the learning data set $D_{1-3}$.

The processor 120 may select one of the at least one dedicated artificial intelligence models generated in each step, and generate a dedicated artificial intelligence model for the selected artificial intelligence model. For example, the processor 120 may select the dedicated artificial intelligence model $N_{2-2}$ which is one of the plurality of dedicated artificial intelligence models $N_{2-1}$, $N_{2-2}$, and $N_{2-3}$ generated in the stage 2, and update the selected dedicated artificial intelligence model $N_{2-2}$ as an artificial intelligence model to be compressed.

The processor 120 may select different learning data sets $D_{2-1}$ and $D_{2-2}$ from the learning data set $D_{1-2}$ that trained the dedicated artificial intelligence model $N_{2-2}$. The processor 120 may repetitively train an artificial intelligence model generated by repetitively compressing the dedicated artificial intelligence model $N_{1-2}$ by using the selected learning data set $D_{2-1}$ and generate a dedicated artificial intelligence model $N_{3-1}$. Likewise, the processor 120 may generate a dedicated artificial intelligence model $N_{3-2}$ trained by using the learning data set $D_{2-2}$ selected from the learning data set $D_{1-2}$.

As described above in FIG. 4 through FIG. 8, the processor 120 may train a dedicated artificial intelligence model generated in each step by using a learning data set selected from the learning data according to a predetermined rule.

Figure 9A:
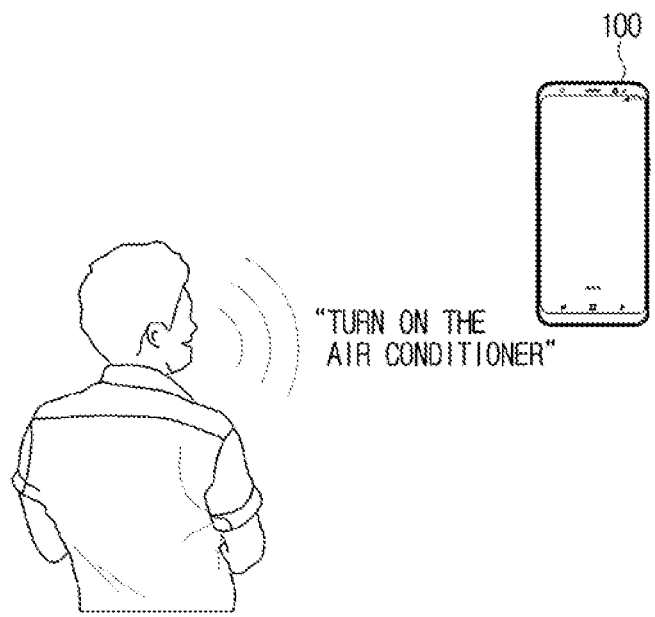
FIG. 9A is a diagram showing an operation of training a dedicated artificial intelligence model by using target data according to an embodiment.
Figure 9B:
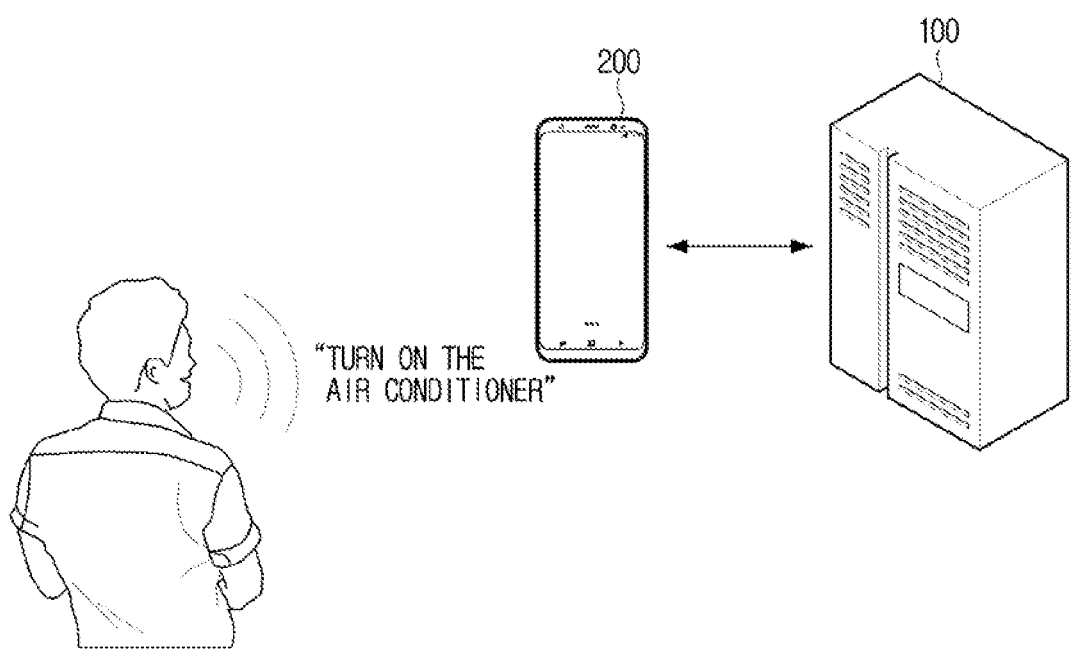
FIG. 9B is a diagram showing an operation of training a dedicated artificial intelligence model by using target data according to an embodiment.
Figure 10:
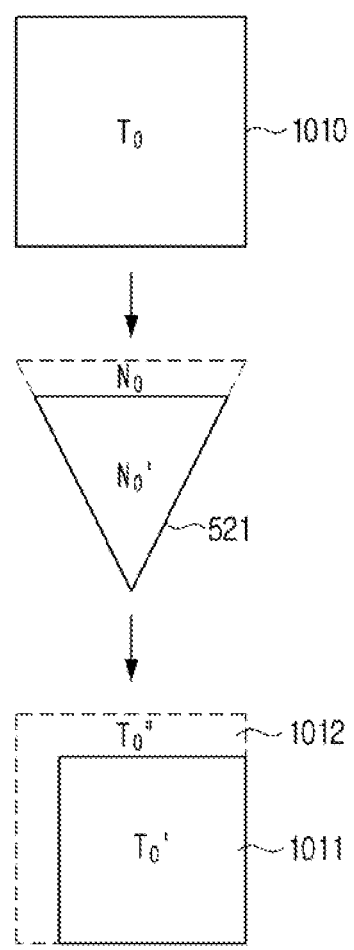
FIG. 10 is a diagram showing an operation of training a dedicated artificial intelligence model based on test data according to an embodiment.
Figure 11:
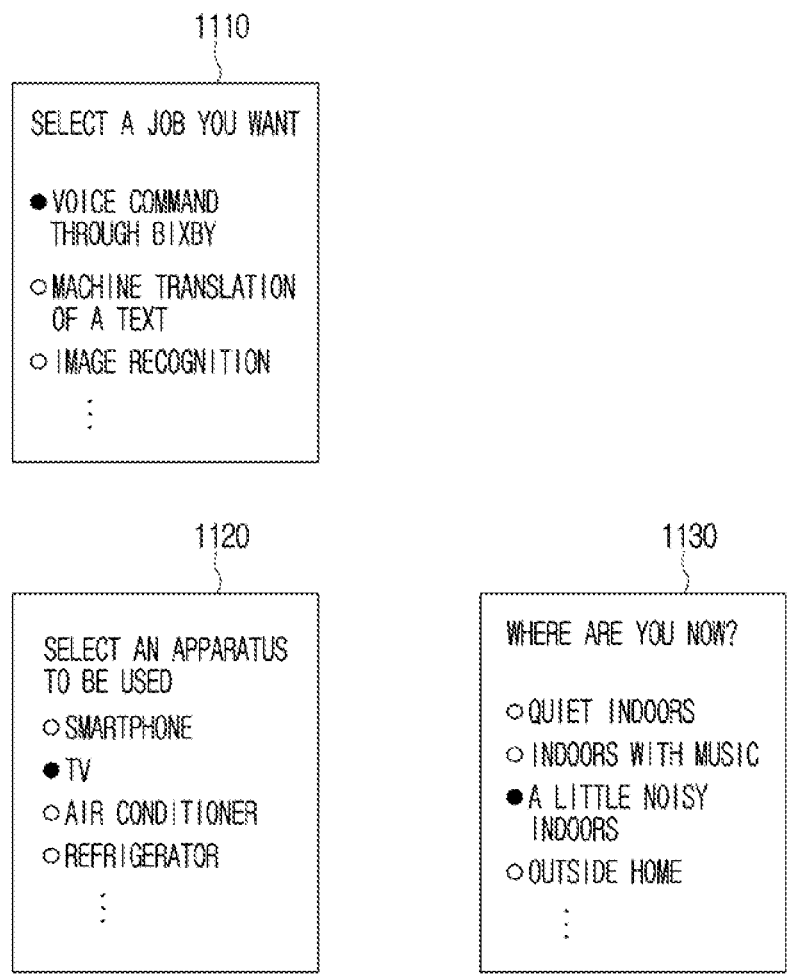
FIG. 11 is a diagram showing an operation of training a dedicated artificial intelligence model based on a user's input according to an embodiment.

FIG. 9 through FIG. 11 are diagrams of a process that selects a learning data set from learning data according to a predetermined rule, and trains a dedicated artificial intelligence model by using the selected learning data set according to an embodiment.

FIG. 9 is a diagram showing the electronic apparatus 100 training a dedicated artificial intelligence model by using target data input into the electronic apparatus 100 according to an embodiment. Specifically, FIG. 9A is a diagram showing an electronic apparatus 100 training a dedicated artificial intelligence model where the electronic apparatus 100 is a user terminal apparatus like a speaker, and FIG. 9B is a diagram showing an electronic apparatus training a dedicated artificial intelligence model where the electronic apparatus 100 is a server.

The processor 120 may receive target data from a user. For example, in case a trained artificial intelligence model is a voice recognition model, the processor 120 may receive a voice command like "Turn the air conditioner" from a user as target data. Then, the processor 120 may perform voice recognition for the voice command "Turn the air conditioner" by making the target data as an input value of the voice recognition model, and provide a response such as "The air conditioner was turned on" to the user as an output value therefor.

The processor 120 may generate a dedicated artificial intelligence model for the target data, and train the generated dedicated artificial intelligence model.

For this, the processor 120 may classify the learning data into a plurality of learning data sets based on the feature information of the learning data. Here, the feature information of the learning data means indicating elements which are meaningful as they have a specific pattern or rule among a plurality of elements included in the learning data as vectors.

Specifically, the processor 120 may determine the feature information of the learning data by using the learning data reconstitution module 112, and classify the learning data into a plurality of learning data sets based on the determined feature information of the learning data.

More specifically, the processor 120 may acquire vector values with the feature information of the learning data by using the learning data reconstitution module 112, and classify the learning data into a plurality of learning data sets based on the distribution of the vector values.

For example, in case the learning data is natural language utterance voice data, the processor 120 may classify the learning data into an utterance without a noise uttered in a quiet environment, an utterance which was uttered in a quiet environment but for which the distance between the sound source and the apparatus is far, an utterance wherein a noise other than the utterance is mixed, etc. based on the vector values of the learning data. Alternatively, the processor 120 may classify the learning data into a woman's utterance, a man's utterance, a child's utterance, a teenager's utterance, utterances for each region, etc. Or, the processor 120 may classify the learning data into smartphone learning data, TV learning data, learning data of an air conditioner, etc. based on the feature vector values of the learning data.

As another example, in a case where the learning data is object recognition data, the processor 120 may classify the learning data into a person (a man, a woman, a child, a crowd), an animal (a dog, a cat, a lion, a tiger, etc.), an object (a natural object, an artificial object, etc.), and the like based on the feature vector values of the learning data.

The processor 120 may identify a learning data set corresponding to the target data among the plurality of classified learning data sets.

For this, the processor 120 may extract the feature information of the target data received from the user.

The processor 120 may compare the extracted feature information of the target data and the feature information of the plurality of learning data sets, and select a learning data set which is identical or similar to the feature information of the target data among the plurality of learning data sets.

Then, the processor 120 may train an artificial intelligence model with the selected learning data set. Specifically, the processor 120 may repetitively compress the generic-purpose artificial intelligence model (or the dedicated artificial intelligence model) prestored in the memory 110, and repetitively train the compressed artificial intelligence model with the selected learning data set. As a result, the processor 120 may generate a new dedicated artificial intelligence model, and train the generated dedicated artificial intelligence model with the selected learning data set.

For example, in case a user made an utterance such as "Turn on the air conditioner" in an environment wherein noises like a TV sound exist, the processor 120 may extract feature information such as a control command of the air conditioner and existence of some noises as the feature information of the target data "Turn on the air conditioner." The processor 120 may select a combination of 'a learning data set for an air conditioner' and 'a learning data set in an environment wherein some noises exist' as learning data sets identical or similar to the feature information of the target data among the plurality of learning data sets.

The processor 120 may repetitively compress the generic-purpose artificial intelligence model prestored in the memory 110 by stages, and train the compressed artificial intelligence model with the combination of 'a learning data set for an air conditioner' and 'a learning data set in an environment wherein some noises exist,' and generate a dedicated artificial intelligence model, and ultimately, the processor 120 may train the generated dedicated artificial intelligence model with the combination of 'a learning data set for an air conditioner' and 'a learning data set in an environment wherein some noises exist.'

The processor 120 may compress the dedicated artificial intelligence model prestored in the memory 110 instead of the generic-purpose artificial intelligence model by stages and train the compressed artificial intelligence model with the combination of the learning data sets. For example, the processor 120 may compress an air conditioner-dedicated artificial intelligence model trained by the learning data set for an air conditioner by stages, and train the compressed artificial intelligence model by using the combination of 'a learning data set for an air conditioner' and 'a learning data set in an environment wherein some noises exist.' As a result, the processor 120 may generate a new dedicated artificial intelligence model trained with the combination of 'a learning data set for an air conditioner' and 'a learning data set in an environment wherein some noises exist' and train the dedicated artificial intelligence model.

As shown in FIG. 9B, the electronic apparatus 100 may be implemented as a server. In this case, the electronic apparatus 100 may be connected with a user terminal apparatus 200 such as a speaker or a TV, and a smartphone and perform communication. Classification by the electronic apparatus 100 of the learning data into a plurality of learning data sets based on the feature information of the learning data being identical to what is shown in FIG. 9A above, and thus explanation in this regard will be omitted.

In a case where a user inputs target data into the user terminal apparatus 200, the user terminal apparatus 200 may transmit the target data to the electronic apparatus 100. The processor 120 that received the target data from the user terminal apparatus 200 may generate a dedicated artificial intelligence model based on the target data, and train the generated dedicated artificial intelligence model.

Specifically, the processor 120 may select a learning data set corresponding to the target data among the plurality of learning data sets, and train the dedicated artificial intelligence model generated by compressing an artificial intelligence model by using the selected learning data set.

The processor 120 may output a result value for the target data by making the target data an input of the generated dedicated artificial intelligence model, and transmit the output result value to the user terminal apparatus 200.

FIG. 10 is a diagram showing a process of training a dedicated artificial intelligence model based on test data according to an embodiment.

The artificial intelligence model 521 in FIG. 10 may be a dedicated artificial intelligence model generated by compressing the generic-purpose artificial intelligence model 520. Here, the dedicated artificial intelligence model 521 may be an artificial intelligence model trained by using the learning data $D_0$.

After generating the dedicated artificial intelligence model, the processor 120 may perform a test for the dedicated artificial intelligence model 521 by using test data $T_0$ 1010. Here, the test data indicates data which has common feature information with the learning data, but which is different data from the learning data.

As the test data has common feature information with the learning data, but is different from the learning data, the dedicated artificial intelligence model 521 may output a target value for the test data, or output a value close to a target value, or output a different value from a target value.

The processor 120 may classify the test data into a plurality of test data sets by using the learning data reconstitution module 112. For example, the processor 120 may classify the test data into a test data set $T'_0$ 1011 that outputs a target value or outputs a value close to a target value or a test data set $T''_0$ 1012 that outputs a different value from a target value.

The processor 120 may select a test data set from the test data based on the test result. Specifically, the processor 120 may select the test data set $T'_0$ 1011 that output a target value or output a value close to a target value.

The processor 120 may identify a learning data set corresponding to the test data set $T'_0$ 1011 selected from the learning data $D_0$ 1010. Specifically, the processor 120 may select a learning data set including common feature information with the test data set $T'_0$ 1011 selected from the learning data $D_0$ 1010.

For example, assuming that the dedicated artificial intelligence model 521 corresponds to a machine translation artificial intelligence model and the learning data is test data in various lengths, the test data may also include text data in various lengths like the learning data. If, as a result of testing the dedicated artificial intelligence model with the test data, the dedicated artificial intelligence model outputs the target value or a value close to the target value for test data including information on 15 or fewer words, but outputs a different value from the target value for test data including information on words exceeding 15, the processor 120 may classify the test data $T_0$ 1010 into the test data set $T'_0$ 1011 including information on 15 or fewer words and the test data set $T''_0$ 1012 including information on words exceeding 15, and identify a learning data set corresponding to the test data set $T'_0$ 1011 including information on 15 or fewer words. That is, the processor 120 may select a learning data set including 15 or fewer words among the learning data sets.

The processor 120 may train a dedicated artificial intelligence model by using the identified learning data set. Here, the processor 120 may generate a dedicated artificial intelligence model 522 by repetitively compressing the dedicated artificial intelligence model 521, and train the generated dedicated artificial intelligence model 522 by using the identified learning data set.

FIG. 11 is a diagram of a process of training a dedicated artificial intelligence model based on a user's input according to an embodiment.

The processor 120 may receive an input for setting learning data from a user through various interfaces included in the electronic apparatus 100.

The processor 120 may control a display to display a user interface (UI) for receiving a user input for setting learning data.

The screens 1110, 1120, and 1130 in FIG. 11 indicate screens displayed on an electronic apparatus including the display such as a TV, a smartphone, a tablet PC, a PC, and a laptop PC. The processor 120 may display a screen 1110 including a UI for inputting a job that a user wants, a screen 1120 including a UI for inputting an apparatus that a user will use, and a screen 1130 including a UI for inputting a surrounding environment of a user. Other than the above, the processor 120 may display screens including various UIs such as a UI for inputting user information such as the age and sex of a user depending on embodiments.

In the case of receiving learning data setting information from a user through a UI displayed on the display, the processor 120 may select a learning data set corresponding to the data setting information from the learning data, and train a dedicated artificial intelligence model by using the selected learning data set.

For example, in a case where a user input setting information of 'performing a voice command through Bixby by using a TV in a little nosy environment' through UIs displayed on the screens 1110, 1120, and 1130, the processor 120 may select a learning data set for a voice command, a learning data set operating in a TV apparatus, and a learning data set for a voice command in a space where some noises exist from the learning data, and train the dedicated artificial intelligence model by using a combination of the selected learning data sets.

FIG. 11 shows that a plurality of learning data sets are selected through a plurality of setting information inputs, but, in other embodiments, learning data sets can be selected through one setting information input.

Also, in FIG. 11, a UI for a user to select one of a plurality of menu items is shown, but a UI for a user to directly input data information may be displayed depending on embodiments.

FIG. 11 shows a user input being received through a UI displayed on the display, but the disclosure is not limited thereto.

According to another embodiment, the processor 120 may set learning data through a voice command through the microphone. For example, in case a user uttered "I want to recognize an animal from the image," the processor 120 may select a learning data set for image recognition and a learning data set recognizing an animal from the learning data, and train the dedicated artificial intelligence model by using a combination of the selected learning data sets.

Figure 12:
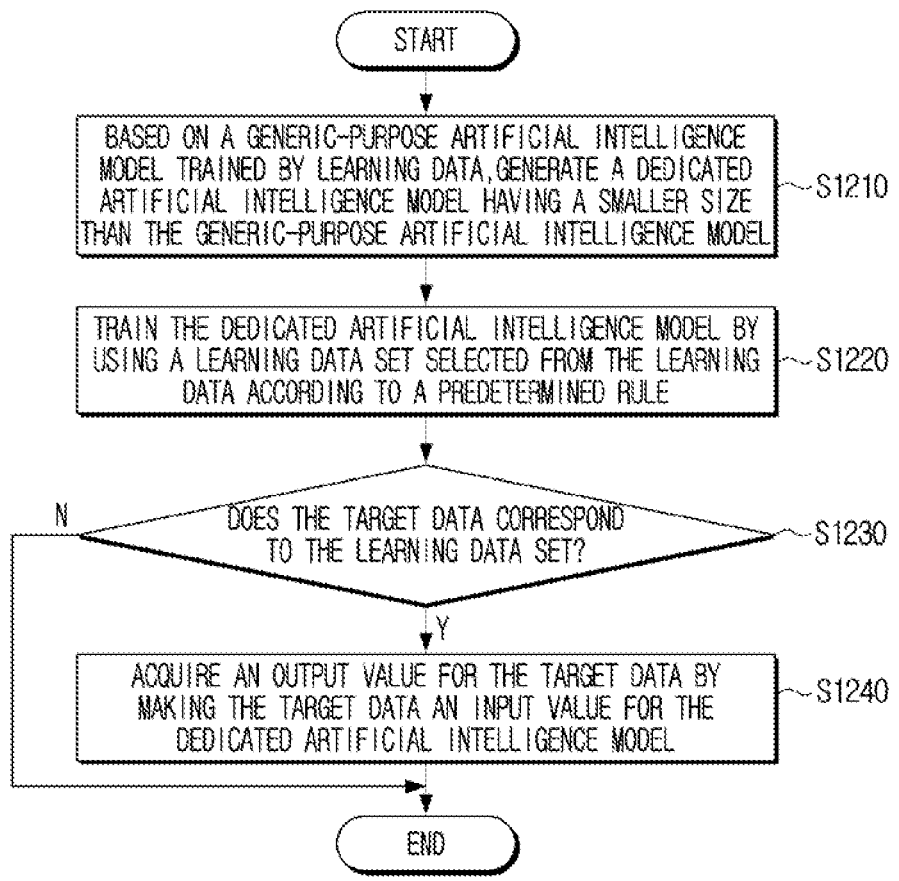
FIG. 12 is a flow chart of a method for controlling an electronic apparatus according to various embodiments.

FIG. 12 is a flow chart of a method for controlling an electronic apparatus according to various embodiments.

First, based on a generic-purpose artificial intelligence model trained by using learning data, a dedicated artificial intelligence model having a smaller size than the generic-purpose artificial intelligence model may be generated in operation S1210. Here, the generic-purpose artificial intelligence model may be a generic-purpose artificial intelligence model trained at the electronic apparatus 100 or an artificial intelligence model trained at an external apparatus such as a server and stored in the electronic apparatus 100.

The dedicated artificial intelligence model may be an artificial intelligence model compressed from the generic-purpose artificial intelligence model, and the size of data related to connections among a plurality of nodes (connections of weight values) included in the dedicated artificial intelligence model may be smaller than the size of data related to connections among a plurality of nodes included in the generic-purpose artificial intelligence model. For example, the number of the connections among the plurality of nodes included in the dedicated artificial intelligence model may be smaller than the number of the connections among the plurality of nodes included in the generic-purpose artificial intelligence model, or the bit numbers of the connections among the plurality of nodes included in the dedicated artificial intelligence model may be smaller than the bit numbers of the connections among the plurality of nodes included in the generic-purpose artificial intelligence model.

Then, a compression parameter related to the dedicated artificial intelligence is model may be determined, and a dedicated artificial intelligence model may be generated by reducing the size of the data related to the number of the connections among the plurality of nodes included in the generic-purpose artificial intelligence model based on the determined compression parameter.

Then, the dedicated artificial intelligence model may be trained by using a learning data set selected from the learning data according to a predetermined rule in operation S1220.

As an example, the dedicated artificial intelligence model may be trained based on target data. The target data means input data for performing an operation by using a trained artificial intelligence model.

Specifically, the electronic apparatus may classify the learning data into a plurality of learning data sets based on feature information of the learning data, and train the dedicated artificial intelligence model with a learning data set corresponding to the target data among the plurality of classified learning data sets. Here, the feature information of the learning data means feature vectors of the learning data, and specifically, it may mean indicating elements having a specific pattern or rule among a plurality of elements included in the learning data as vectors.

As another example, the dedicated artificial intelligence model may be trained based on test data. Here, the test data indicates data which has common feature information with the learning data, but which is different data from the learning data.

Specifically, the electronic apparatus may test the generic-purpose artificial intelligence model or the dedicated artificial intelligence model generated based on the generic-purpose artificial intelligence model by using the test data.

A test data set may be selected from the test data based on the test result. For example, a test data set that output a target value or a value close to a target value may be selected in the test data based on the test result.

Then, a learning data set corresponding to the test data set selected from the learning data may be identified, and the dedicated artificial intelligence model may be trained by using the identified learning data set.

As another example, data setting information may be received from a user, and the dedicated artificial intelligence model may be trained based on the received data setting information.

The electronic apparatus may display a UI for receiving user data setting information, and receive a user input through the displayed UI.

In the case of receiving data setting information from a user, a learning data set corresponding to the data setting information may be selected from the learning data, and the dedicated artificial intelligence model may be trained by using the selected learning data set.

A learning data set included in the learning data may be selected according to the aforementioned predetermined rule, and it may be determined whether the selected learning data set satisfies a predetermined condition. Then, in case the selected learning data set satisfies the predetermined condition, the dedicated artificial intelligence model may be trained by using the selected learning data set.

For example, it may be determined whether the size of the selected learning data set is greater than or equal to a predetermined value, and in case the size of the selected learning data set is greater than or equal to the predetermined value, the dedicated artificial intelligence model may be trained.

The performance of the dedicated artificial intelligence model may be determined by testing the trained dedicated artificial intelligence model.

If, as a result of testing the dedicated artificial intelligence model, the performance of the dedicated artificial intelligence model is greater than or equal to a first threshold value and smaller than or equal to a second threshold value, information on the dedicated artificial intelligence model and information on the learning data set that the dedicated artificial intelligence model learned may be stored.

A dedicated artificial intelligence model may be generated based on the generic-purpose artificial intelligence model, and another dedicated artificial intelligence model may be generated based on the generated dedicated artificial intelligence model.

Specifically, a dedicated artificial intelligence model may be generated by compressing the generic-purpose artificial intelligence model, and the dedicated artificial intelligence model may be trained by using a learning data set included in the learning data. Here, in a case where the performance of the dedicated artificial intelligence model is greater than or equal to the predetermined value as a result of testing the trained dedicated artificial intelligence model, another dedicated artificial intelligence model may be generated based on the dedicated artificial intelligence model.

The electronic apparatus 100 may receive target data. In a case where the target data corresponds to one learning data set among the plurality of learning data sets included in the learning data in operation S1230—Y, an output value for the target data may be acquired by making the target data an input value of the dedicated artificial intelligence model in operation S1240. The dedicated artificial intelligence model in this case may be a dedicated artificial intelligence model trained with the learning data set corresponding to the target data.

Specifically, feature information of the target data may be determined, and feature information of the learning data set may be determined, and in case the feature information of the target data corresponds to the feature information of the learning data set, an output value for the target data may be acquired by making the target data an input value of the dedicated artificial intelligence model.

As another example, in a case where information on a learning data set and information on a dedicated artificial intelligence model trained with the learning data set are stored in the electronic apparatus, information on a learning data set corresponding to the feature information of the target data among the information on the plurality of learning data sets stored in the electronic apparatus may be identified, and a dedicated artificial intelligence model may be generated based on the information on the dedicated artificial intelligence model trained by using the identified learning data set. Then, an output value for the target data may be acquired by making the target data an input value of the generated dedicated artificial intelligence model.

In the above description, the various operations described as being performed through the electronic apparatus 100 or an external apparatus of the electronic apparatus 100 may be performed through one or more electronic apparatuses in the form of a controlling method or an operating method of the electronic apparatus. For example, the features of generating a dedicated artificial intelligence model, training the generated dedicated artificial intelligence model, and determining a compression parameter for the dedicated artificial intelligence model may be performed at an external apparatus, and at the electronic apparatus 100, only an operation for target data may be performed by using information on a dedicated artificial intelligence model and information on learning data.

The various embodiments described above may be implemented in a recording medium that can be read by a computer or an apparatus similar to a computer, by using software, hardware, or a combination thereof.

According to implementation by hardware, embodiments may be implemented by using at least one of application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, or an electronic unit for performing various functions.

In some cases, the embodiments may be implemented as the processor itself. According to implementation by software, the embodiments may be implemented as separate software modules. Each of the software modules may perform one or more functions and operations described in this specification.

Computer instructions for executing the processing operations according to the various embodiments may be stored in a non-transitory computer readable medium. Such computer instructions stored in a non-transitory computer readable medium may make the processing operations according to the various embodiments performed by a specific machine, when they are executed by a processor.

A non-transitory computer readable medium refers to a medium that stores data semi-permanently, and is readable by machines, but not a medium that stores data for a short moment such as a register, a cache, and a memory. Specifically, the aforementioned various applications or programs may be provided while being stored in a non-transitory computer readable medium such as a CD, a DVD, a hard disk, a blue-ray disk, a USB, a memory card, a ROM and the like.

Also, while preferred embodiments have been shown and described, the disclosure is not limited to the aforementioned specific embodiments, and it is apparent that various modifications may be made by those having ordinary skill in the technical field to which the disclosure belongs, without departing from the gist of the disclosure as claimed by the appended claims. Also, it is intended that such modifications are not to be interpreted independently from the technical idea or prospect of the disclosure.

The invention claimed is:

1. A method for controlling an electronic apparatus, the method comprising:
receiving target data to be input as an input value of an operation;
selecting a generic-purpose artificial intelligence model;
generating a compressed artificial intelligence model based on the selected generic-purpose artificial intelligence model, wherein the generating of the compressed artificial intelligence model comprises compressing the selected generic-purpose artificial intelligence model using a low rank approximation algorithm by applying a singular value decomposition (SVD) algorithm for one matrix, and training the compressed artificial intelligence model;
generating a dedicated artificial intelligence model based on the compressed artificial intelligence model;
acquiring output data by performing the operation using the dedicated artificial intelligence model; and
providing the output data through an output interface,
wherein the generating of the compressed artificial intelligence model further comprises:
acquiring a rank of the SVD algorithm based on a compression rate,
compressing and training the selected generic-purpose artificial intelligence model based on the acquired rank and converting the compressed artificial intelligence model into a converted compressed artificial intelligence model,
determining a performance of the converted compressed artificial intelligence model based on a predetermined first threshold value, and
based on the performance of the converted compressed artificial intelligence model being lower than the predetermined first threshold value, generating the dedicated artificial intelligence model.

2. The method of claim 1, wherein the generating a of the compressed artificial intelligence model comprises:
based on the performance of the converted compressed artificial intelligence model being higher than or equal to the predetermined first threshold value, repeating the generating a compressed of the compressed artificial intelligence model.

3. The method of claim 1, wherein the generating of the dedicated artificial intelligence model comprises:
retraining the compressed artificial intelligence model based on a predetermined learning data set.

4. The method of claim 3, wherein the generating of the dedicated artificial intelligence model comprises:

determining a performance of the retrained compressed artificial intelligence model in relation to a predetermined second threshold value; and based on the performance of the retrained compressed artificial intelligence model being higher than or equal to the predetermined second threshold value, additionally compressing the retrained compressed artificial intelligence model and generating the dedicated artificial intelligence model.

5. The method of claim 3, wherein the generating of the dedicated artificial intelligence model comprises:

based on feature information of first learning data that trained the selected generic-purpose artificial intelligence model, classifying the first learning data into a plurality of learning data sets, and reconstituting at least one data set among the plurality of learning data sets as the predetermined learning data set.

6. The method of claim 5, wherein the predetermined learning data set comprises at least one data set compressed to correspond to the target data input to be as the input value among the plurality of learning data sets.

7. The method of claim 3, wherein the generating of the compressed artificial intelligence model comprises:

determining a performance of the converted compressed artificial intelligence model based on test data, and wherein the generating of the dedicated artificial intelligence model comprises:

classifying the test data into a plurality of learning data sets, and reconstituting at least one data set among the plurality of learning data sets as the predetermined learning data set.

8. The method of claim 7, wherein the test data includes test data that output a result within a predetermined range based on a target value.

9. The method of claim 3, wherein the generating of the dedicated artificial intelligence model comprises:

based on receiving data setting information from a user, identifying a learning data set corresponding to the data setting information from a first learning data that trained the selected generic-purpose artificial intelligence model, and reconstituting the identified learning data set as the predetermined learning data set.

10. An electronic apparatus comprising:

a memory storing first learning data and a generic-purpose artificial intelligence model trained by the first learning data; and a processor, wherein the processor is configured to:

receive target data to be input as an input value of an operation, select the trained generic-purpose artificial intelligence model, acquire a rank of a singular value decomposition (SVD) algorithm based on a compression rate, compress and train the selected generic-purpose artificial intelligence model based on the acquired rank and convert the compressed artificial intelligence model into a converted compressed artificial intelligence model, determine a performance of the converted compressed artificial intelligence model based on a predetermined first threshold value, based on the performance of the converted compressed artificial intelligence model being lower than the predetermined first threshold value, generate a dedicated artificial intelligence model, acquire output data by performing the operation using the dedicated artificial intelligence model, and provide the output data through an output interface, wherein the processor is further configured to:

compress the selected generic-purpose artificial intelligence model using a low rank approximation algorithm by applying the SVD algorithm for one matrix, and train the compressed artificial intelligence model.

11. The electronic apparatus of claim 10, wherein the processor is further configured to:

based on the performance of the converted compressed artificial intelligence model being higher than or equal to the predetermined first threshold value, repeat the converting of the compressed artificial intelligence model into the converted compressed artificial intelligence model.

12. The electronic apparatus of claim 10, wherein the processor is further configured to:

retrain the compressed artificial intelligence model based on a predetermined learning data set.

13. The electronic apparatus of claim 12, wherein the processor is further configured to:

determine a performance of the retrained compressed artificial intelligence model in relation to a predetermined second threshold value; and based on the performance of the retrained compressed artificial intelligence model being higher than or equal to the predetermined second threshold value, additionally compress the retrained compressed artificial intelligence model and generate the dedicated artificial intelligence model.

14. The electronic apparatus of claim 12, wherein the processor is further configured to:

based on feature information of the first learning data that trained the selected generic-purpose artificial intelligence model, classify the first learning data into a plurality of learning data sets, and reconstitute at least one data set among the plurality of learning data sets as the predetermined learning data set.

15. The electronic apparatus of claim 12, wherein the processor is further configured to:

determine the performance of the compressed artificial intelligence model based on test data;

classify the test data into a plurality of learning data sets; and reconstitute at least one data set among the plurality of learning data sets as the predetermined learning data set.

* * * * *